(12) United States Patent
Shang et al.

(10) Patent No.: US 11,723,249 B2
(45) Date of Patent: Aug. 8, 2023

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Tinghua Shang, Beijing (CN); Huijuan Yang, Beijing (CN); Tingliang Liu, Beijing (CN); Yi Zhang, Beijing (CN); Hao Zhang, Beijing (CN); Lulu Yang, Beijing (CN); Yang Zhou, Beijing (CN); Xiaofeng Jiang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 122 days.

(21) Appl. No.: 17/606,424

(22) PCT Filed: Dec. 25, 2020

(86) PCT No.: PCT/CN2020/139199
§ 371 (c)(1),
(2) Date: Oct. 25, 2021

(87) PCT Pub. No.: WO2022/133972
PCT Pub. Date: Jun. 30, 2022

(65) Prior Publication Data
US 2022/0399427 A1 Dec. 15, 2022

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC .. H10K 59/131; G09G 3/3233; G09G 3/3291; G09G 3/3266
See application file for complete search history.

(56) References Cited

U.S. PATENT DOCUMENTS

2005/0243039 A1 11/2005 Kwak
2018/0366530 A1 12/2018 Seo et al.
(Continued)

FOREIGN PATENT DOCUMENTS

CN 109786434 A 5/2019
CN 110021654 A 7/2019
(Continued)

OTHER PUBLICATIONS

International Search Report & Written Opinion dated Sep. 27, 2021, regarding PCT/CN2020/139199.

*Primary Examiner* — Sardis F Azongha
(74) *Attorney, Agent, or Firm* — Intellectual Valley Law, P.C.

(57) ABSTRACT

An array substrate is provided. A first virtual line and a second virtual line respectively cross over a first voltage supply line, a second voltage supply line, and a third voltage supply line. The first voltage supply line, the second voltage supply line, and the third voltage supply line respectively include a first voltage supply line portion, a second voltage supply line portion, and a third voltage supply line portion, respectively between the first virtual line and the second virtual line. An orthographic projection of a third anode of a third light emitting element on a base substrate completely covers an orthographic projection of the third voltage supply
(Continued)

line portion on the base substrate. The third voltage supply line portion has a line width greater than a line width of the first voltage supply line portion, and greater than a line width of the second voltage supply line portion.

20 Claims, 35 Drawing Sheets

(52) U.S. Cl.
CPC ............... *G09G 2300/0439* (2013.01); *G09G 2300/0819* (2013.01); *G09G 2300/0842* (2013.01); *G09G 2300/0861* (2013.01); *G09G 2320/0242* (2013.01)

(56) References Cited

U.S. PATENT DOCUMENTS

| | | |
|---|---|---|
| 2019/0304356 A1 | 10/2019 | Ka et al. |
| 2021/0159292 A1 | 5/2021 | Zhang et al. |
| 2021/0183313 A1 | 6/2021 | Dong et al. |
| 2021/0233989 A1 | 7/2021 | Li et al. |

FOREIGN PATENT DOCUMENTS

| | | |
|---|---|---|
| CN | 110047898 A | 7/2019 |
| CN | 110610980 A | 12/2019 |
| CN | 111128080 A | 5/2020 |
| CN | 210984240 U | 7/2020 |
| CN | 112038381 A | 12/2020 |

ARRAY SUBSTRATE AND DISPLAY APPARATUS

CROSS-REFERENCE TO RELATED APPLICATION

This application is a national stage application under 35 U.S.C. § 371 of International Application No. PCT/CN2020/139199, filed Dec. 25, 2020, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness. Relevant parameters for an OLED display panel include energy consumption, brightness, color coordinates, and color shift.

SUMMARY

In one aspect, the present disclosure provides an array substrate, comprising a first data line, a second data line, and a third data line configured to provide data signals respectively to a first pixel driving circuit, a second pixel driving circuit, and a third pixel driving circuit; a first voltage supply line, a second voltage supply line, and a third voltage supply line configured to provide a constant voltage signal respectively to the first pixel driving circuit, the second pixel driving circuit, and the third pixel driving circuit; and a first light emitting element, a second light emitting element, and a third light emitting element respectively connected to the first pixel driving circuit, the second pixel driving circuit, and the third pixel driving circuit; wherein a first virtual line and a second virtual line respectively cross over the first voltage supply line, the second voltage supply line, and the third voltage supply line; the first voltage supply line, the second voltage supply line, and the third voltage supply line respectively comprise a first voltage supply line portion, a second voltage supply line portion, and a third voltage supply line portion, respectively between the first virtual line and the second virtual line; an orthographic projection of a third anode of the third light emitting element on a base substrate completely covers an orthographic projection of the third voltage supply line portion on the base substrate; and the third voltage supply line portion has a third line width greater than a first line width of the first voltage supply line portion, and greater than a second line width of the second voltage supply line portion.

Optionally, the first virtual line and the second virtual line further respectively cross over the first data line, the second data line, the third data line; the first data line, the second data line, the third data line respectively comprise a first data line portion, a second data line portion, a third data line portion, respectively between the first virtual line and the second virtual line; and the first data line portion, the second data line portion, and the third data line portion have a substantially same line width.

Optionally, the orthographic projection of the third anode on the base substrate is at least partially overlapping with an orthographic projection of the third data line portion on the base substrate.

Optionally, the first data line, the second data line, the third data line, the first voltage supply line, the second voltage supply line, and the third voltage supply line are substantially parallel to each other; and data lines and voltage supply lines are alternatively arranged in an order in which the first voltage supply line, the first data line, the second voltage supply line, the second data line, the third voltage supply line and the third data line are arranged sequentially.

Optionally, the third voltage supply line portion comprises a main sub-portion and a widening sub-portion; the main sub-portion is between the widening sub-portion and the third data line; and the main sub-portion, the first voltage supply line portion, and the second voltage supply line portion have a same shape.

Optionally, the main sub-portion, the first voltage supply line portion, and the second voltage supply line portion have a same shape and a same width.

Optionally, a first anode of the first light emitting element is between the first voltage supply line and the second data line; and a second anode of the second light emitting element is between the first voltage supply line and the second data line.

Optionally, an orthographic projection of the first anode on the base substrate at least partially overlaps with an orthographic projection of the first data line on the base substrate and at least partially overlaps with an orthographic projection of the second voltage supply line on the base substrate; and an orthographic projection of the second anode on the base substrate at least partially overlaps with an orthographic projection of the first data line on the base substrate and at least partially overlaps with an orthographic projection of the second voltage supply line on the base substrate.

Optionally, the orthographic projection of the first anode on the base substrate further at least partially overlaps with an orthographic projection of the first voltage supply line on the base substrate; and the orthographic projection of the second anode on the base substrate at least partially overlaps with an orthographic projection of the first voltage supply line on the base substrate.

Optionally, the array substrate further comprises a first anode contact pad, a second anode contact pad, and a third anode contact pad; a planarization layer on a side of the first anode contact pad, the second anode contact pad, and the third anode contact pad away from the base substrate; a first anode contact hole, a second anode contact hole, a third anode contact hole respectively extending through the planarization layer; a pixel definition layer on a side of the first anode, the second anode, and the third anode away from the planarization layer; a first subpixel aperture, a second subpixel aperture, and a third subpixel aperture respectively extending through the pixel definition layer; and a first light emitting layer, a second light emitting layer, and a third light emitting layer on a side of the pixel definition layer away from the base substrate; wherein the first anode, the second anode, and the third anode are respectively connected to the first anode contact pad, the second anode contact pad, and the third anode contact pad, respectively through the first anode contact hole, the second anode contact hole, and the third anode contact hole; and the first light emitting layer, the second light emitting layer, and the third light emitting layer are respectively connected to the first anode, the second anode, and the third anode, respectively through the first subpixel aperture, the second subpixel aperture, and the third subpixel aperture.

Optionally, the first anode contact hole is outside a region having the first subpixel aperture; the second anode contact hole is outside a region having the second subpixel aperture; and the third anode contact hole is outside a region having the third subpixel aperture.

Optionally, the array substrate further comprises at least one insulating layer between the base substrate and the first anode contact pad, the second anode contact pad, and the third anode contact pad; a first pad contact via, a second pad contact via, and a third pad contact via respectively extending through the at least one insulating layer; and the first anode contact pad, the second anode contact pad, and the third anode contact pad are respectively connected to the first pixel driving circuit, the second pixel driving circuit, and the third pixel driving circuit, respectively through the first pad contact via, the second pad contact via, and the third pad contact via.

Optionally, along a direction of the first virtual line or the second virtual line, the first anode contact hole is between the first pad contact via and the first voltage supply line; along the direction of the first virtual line or the second virtual line, the second anode contact hole is between the second pad contact via and the second voltage supply line; and the third pad contact via and the third anode contact hole are arranged along a direction substantially parallel to the third data line and the third voltage supply line.

Optionally, the first anode comprises a first main portion and a first bridge portion; the second anode comprises a second main portion and a second bridge portion; the third anode comprises a third main portion and a third bridge portion; the first main portion, the second main portion, and the third main portion have a substantially rectangular shape; and the first bridge portion, the second bridge portion, and the third bridge portion respectively protruding outward from the first main portion, the second main portion, and the third main portion.

Optionally, the array substrate further comprises a first anode contact pad, a second anode contact pad, and a third anode contact pad; a planarization layer on a side of the first anode contact pad, the second anode contact pad, and the third anode contact pad away from the base substrate; a first anode contact hole, a second anode contact hole, a third anode contact hole respectively extending through the planarization layer; wherein the first bridge portion, the second bridge portion, and the third bridge portion are respectively connected to the first anode contact pad, the second anode contact pad, and the third anode contact pad, respectively through the first anode contact hole, the second anode contact hole, and the third anode contact hole.

Optionally, the third bridge portion protrudes outward from the third main portion along a direction substantially parallel to the first virtual line or the second virtual line; the second bridge portion protrudes outward from the second main portion along a direction substantially parallel to the second data line or the second voltage supply line; and the first bridge portion protrudes outward from the first main portion along a direction at an angle oblique to the first virtual line and to the first data line.

Optionally, the first data line, the second data line, and the third data line further configured to provide the data signals respectively to a fourth pixel driving circuit, a fifth pixel driving circuit, and a sixth pixel driving circuit; the first pixel driving circuit, the second pixel driving circuit, and the third pixel driving circuit are sequentially arranged along a direction substantially parallel to the first virtual line or the second virtual line; the fourth pixel driving circuit, the fifth pixel driving circuit, and the sixth pixel driving circuit are sequentially arranged along the direction substantially parallel to the first virtual line or the second virtual line; the first pixel driving circuit and the fourth pixel driving circuit are arranged along a direction substantially parallel to the first data line or the first voltage supply line; the second pixel driving circuit and the fifth pixel driving circuit are arranged along a direction substantially parallel to the second data line or the second voltage supply line; and the third pixel driving circuit and the sixth pixel driving circuit are arranged along a direction substantially parallel to the third data line or the third voltage supply line.

Optionally, the first light emitting element is driven by the first pixel driving circuit, and is at least partially in a region having the fifth pixel driving circuit; the second light emitting element is driven by the second pixel driving circuit, is partially in a region having the first pixel driving circuit, and partially in a region having the second pixel driving circuit; and the third light emitting element is driven by the third pixel driving circuit, is partially in a region having the third pixel driving circuit, and partially in a region having the sixth pixel driving circuit.

Optionally, the third line width is in a range of 8.0 μm to 10.0 μm, the first line width is in a range of 5.0 μm to 6.0 μm, and the second line width is in a range of 5.0 μm to 6.0 μm.

In another aspect, the present disclosure provides a display apparatus, comprising the array substrate described herein or fabricated by a method described herein, and an integrated circuit connected to the array substrate

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a first data line, a second data line, and a third data line configured to provide data signals respectively to a first pixel driving circuit, a second pixel driving circuit, and a third pixel driving circuit; a first voltage supply line, a second voltage supply line, and a third voltage supply line configured to provide a high voltage signal respectively to the first pixel driving circuit, the second pixel driving circuit, and the third pixel driving circuit; and a first light emitting element, a second light emitting element, and a third light emitting element respectively connected to the first pixel driving circuit, the second pixel driving circuit, and the third pixel driving circuit. Optionally, a first virtual line and a second virtual line respectively cross over the first voltage supply line, the second voltage supply line, and the third voltage supply line. Optionally, the first voltage supply line, the second voltage supply line, and the third voltage supply line respectively comprise a first voltage supply line portion, a second voltage supply line portion, and a third voltage supply line portion, respectively between the first virtual line and the second virtual line. Optionally, an orthographic projection of a third anode of the third light emitting element on a base substrate completely covers an orthographic projection of the third voltage supply line portion on the base substrate. Optionally, the third voltage supply line portion has a third line width greater than a first line width of the first voltage supply line portion, and greater than a second line width of the second voltage supply line portion.

Figure 1:
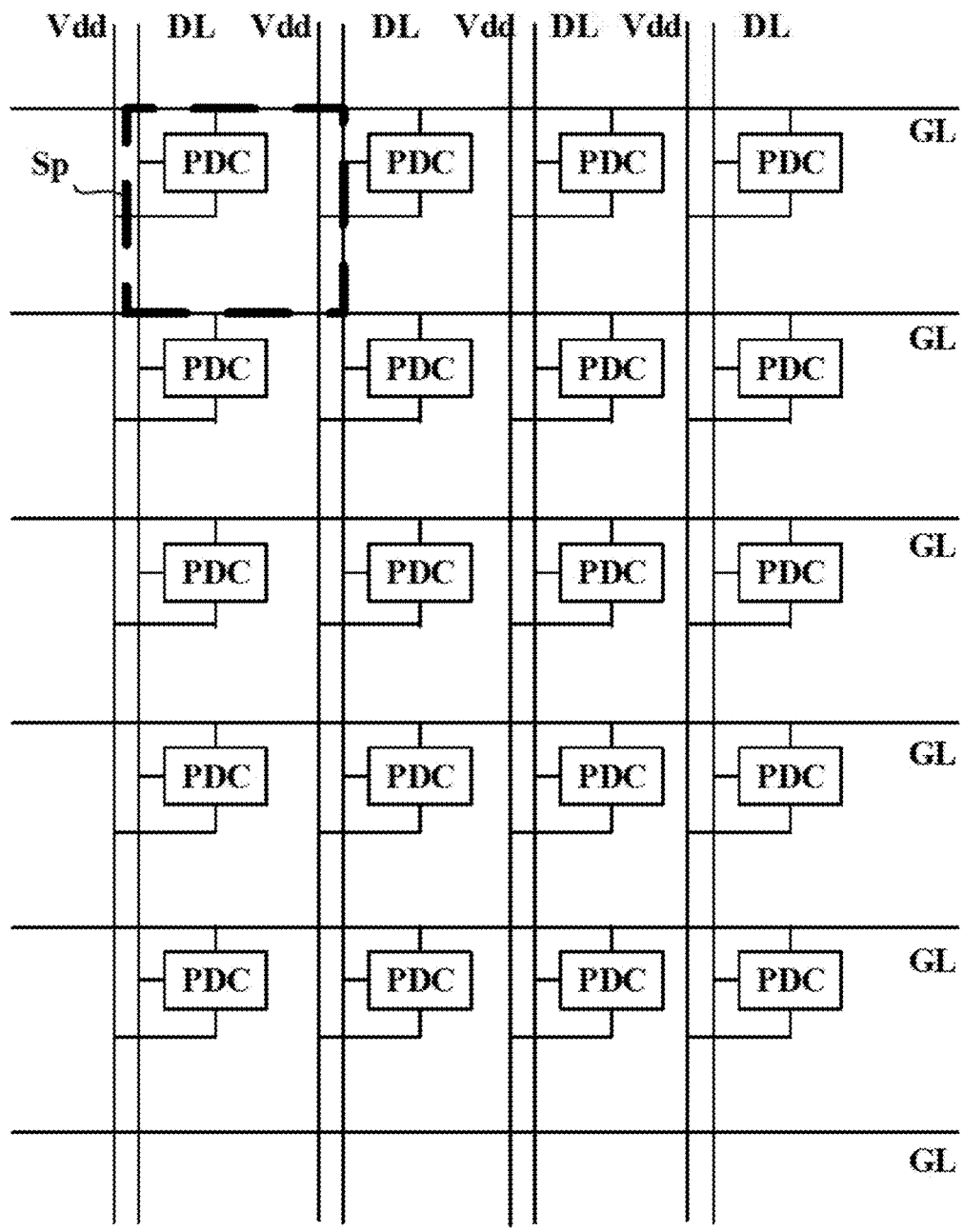
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a gate line GL, a data line DL, a voltage supply line (e.g., a high voltage supply line Vdd), and a second voltage supply line (e.g., a low voltage supply line Vss), each of which electrically connected to the pixel driving circuit PDC. Light emission in a respective one of the subpixels Sp is driven by a pixel driving circuit PDC. In one example, a high voltage signal (e.g., a VDD signal in a range of 3 V to 5 V) is input, through the high voltage support line Vdd, to the pixel driving circuit PDC connected to an anode of the light emitting element; a low voltage signal (e.g., a VSS signal in a range of 0 V to −5 V) is input, through a low voltage supply line Vss, to a cathode of the light emitting element. A voltage difference between the high voltage signal (e.g., the VDD signal) and the low voltage signal (e.g., the VSS signal) is a driving voltage ΔV that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 5T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2:
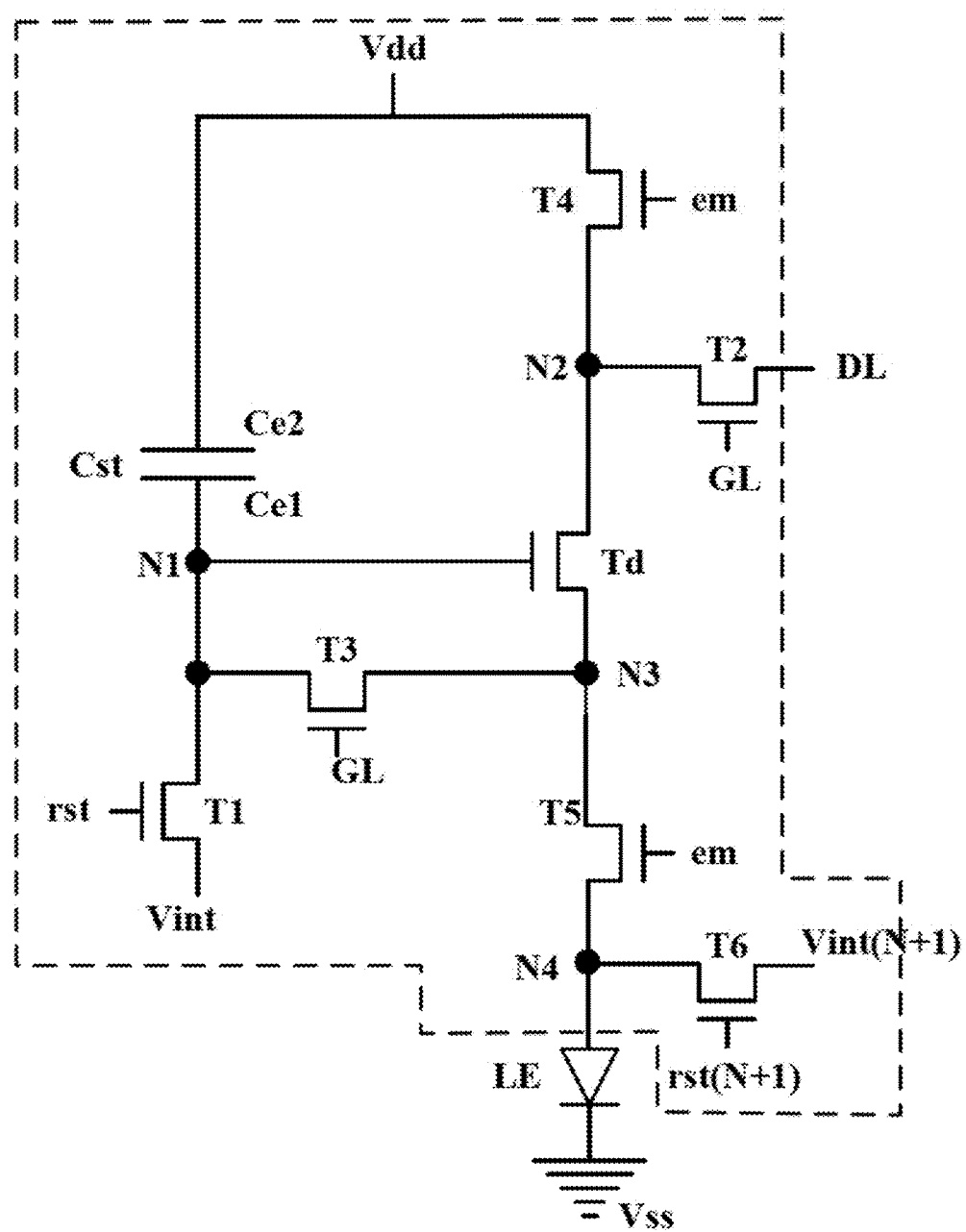
FIG. 2 is a circuit diagram illustrating the structure of a pixel driving circuit in some embodiments according to the present disclosure.

FIG. 2 is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a reset control signal line rst in a present stage, a source electrode connected to a reset signal line Vint in a present stage of a plurality of reset signal line, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a reset control signal line rst(N+1) in a next stage, a source electrode connected to a reset signal line Vint(N+1) in the next stage, and a drain electrode connected to the drain electrode of the fifth transistor and the anode of the light emitting element LE. The second capacitor electrode Ce2 is connected to the respective voltage supply line and the source electrode of the fourth transistor T4.

Figure 3:
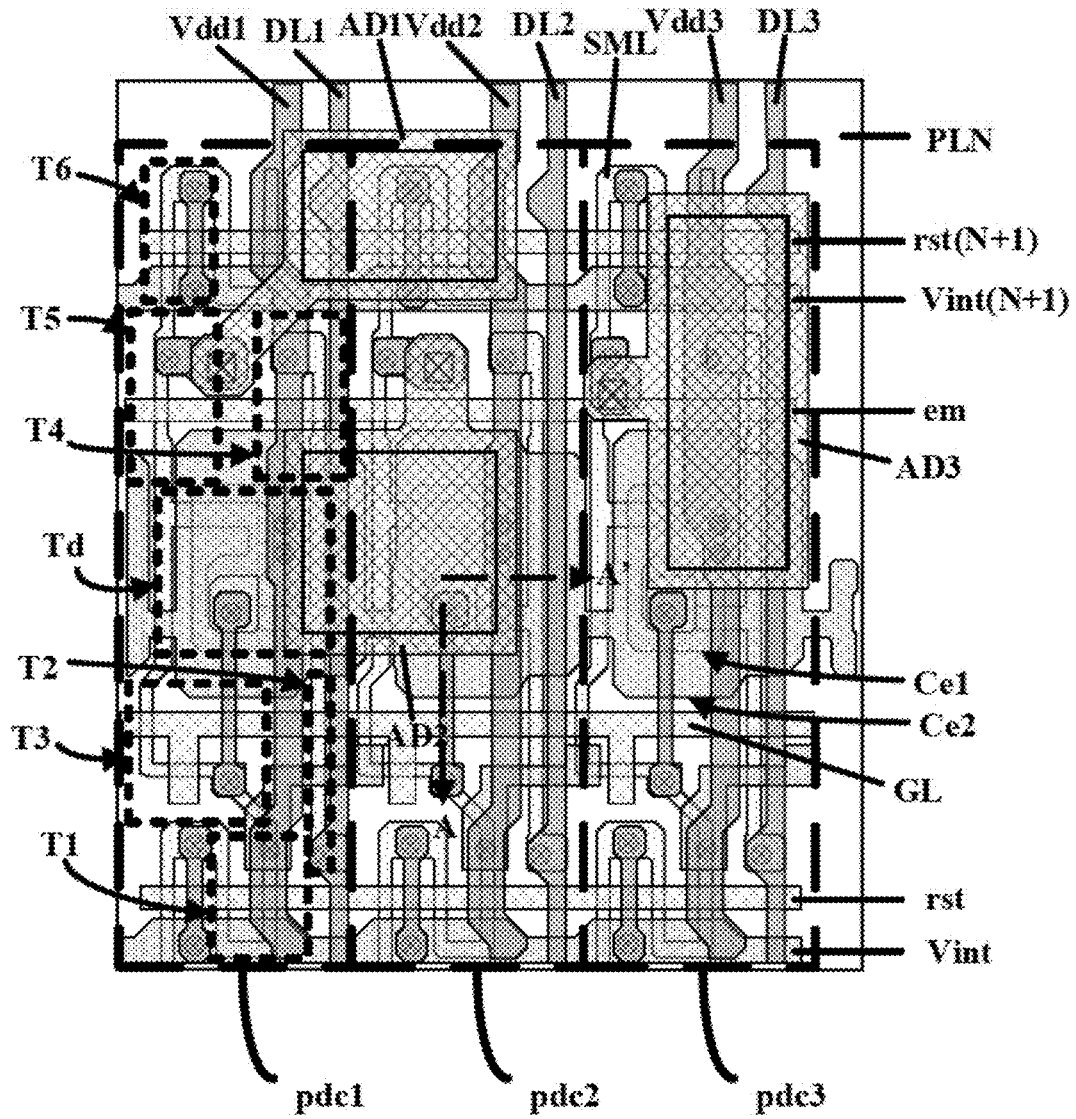
FIG. 3 is a diagram illustrating the structure of a plurality of subpixels of an array substrate in some embodiments according to the present disclosure.

FIG. 3 is a diagram illustrating the structure of a plurality of subpixels of an array substrate in some embodiments according to the present disclosure. Referring to FIG. 3, the array substrate in some embodiments includes a first data line DL1, a second data line DL2, and a third data line DL3 configured to provide data signals respectively to a first pixel driving circuit pdc1, a second pixel driving circuit pdc2, and a third pixel driving circuit pdc3; and a first voltage supply line Vdd1, a second voltage supply line Vdd2, and a third voltage supply line Vdd3 configured to provide a high voltage signal (a constant voltage signal) respectively to the first pixel driving circuit pdc1, the second pixel driving circuit pdc2, and the third pixel driving circuit pdc3. In one example, the first pixel driving circuit pdc1, the second pixel driving circuit pdc2, and the third pixel driving circuit pdc3 are configured to respectively drive image display in a first subpixel, a second subpixel, and a third subpixel. In one example, the first subpixel, the second subpixel, and the third subpixel are respectively a red subpixel, a green subpixel, and a blue subpixel.

Figure 4:
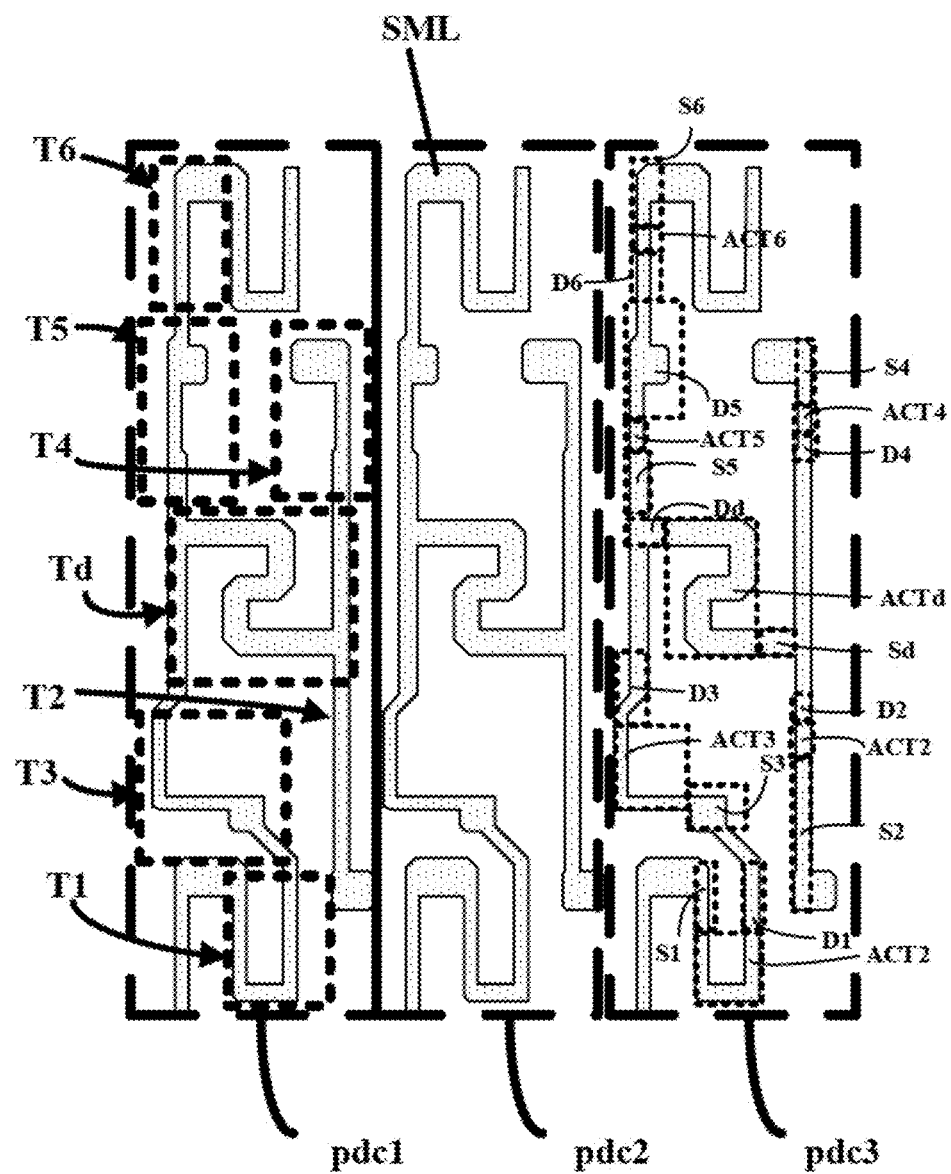
FIG. 4 is a diagram illustrating the structure of a semiconductor material layer in a plurality of subpixels of an array substrate in some embodiments according to the present disclosure.
Figure 5:
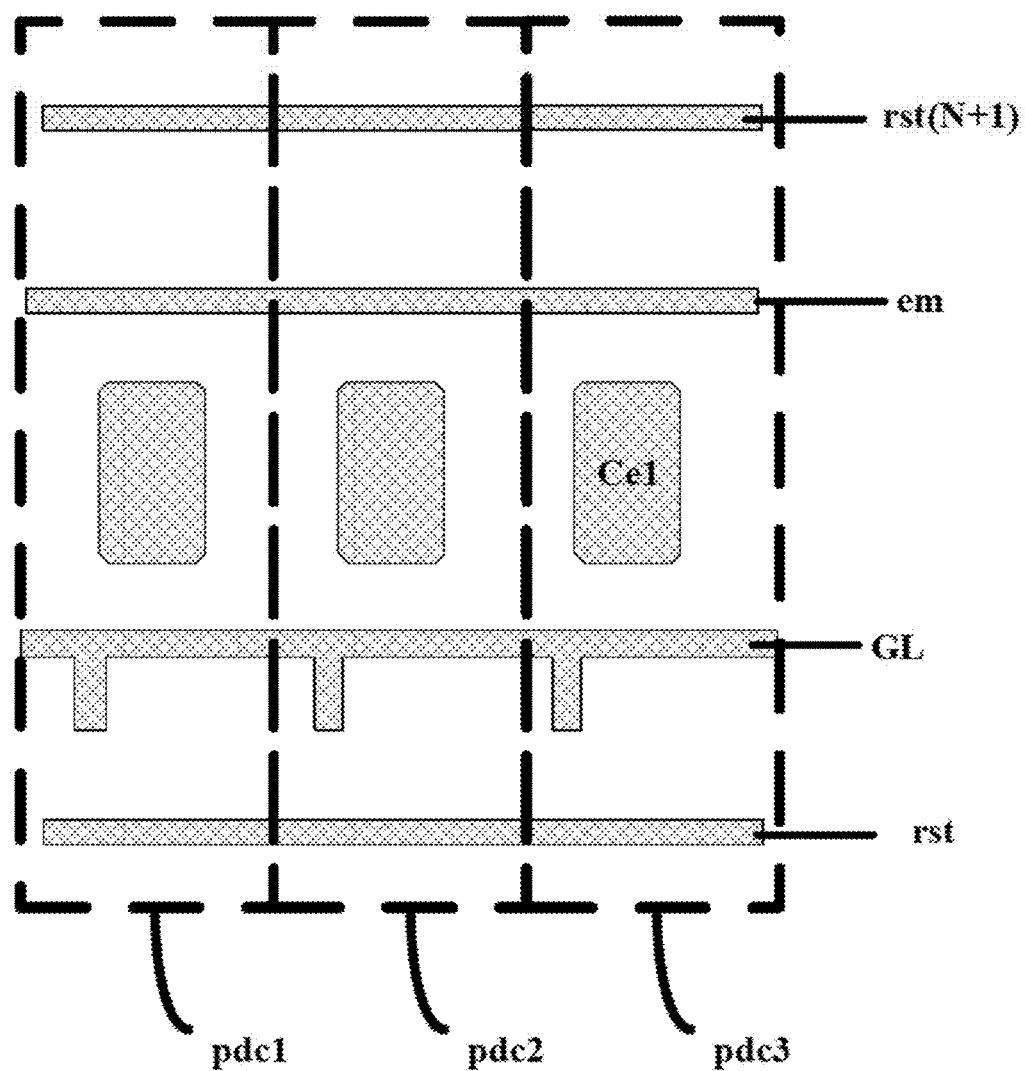
FIG. 5 is a diagram illustrating the structure of a first conductive layer in a plurality of subpixels of an array substrate in some embodiments according to the present disclosure.
Figure 6:
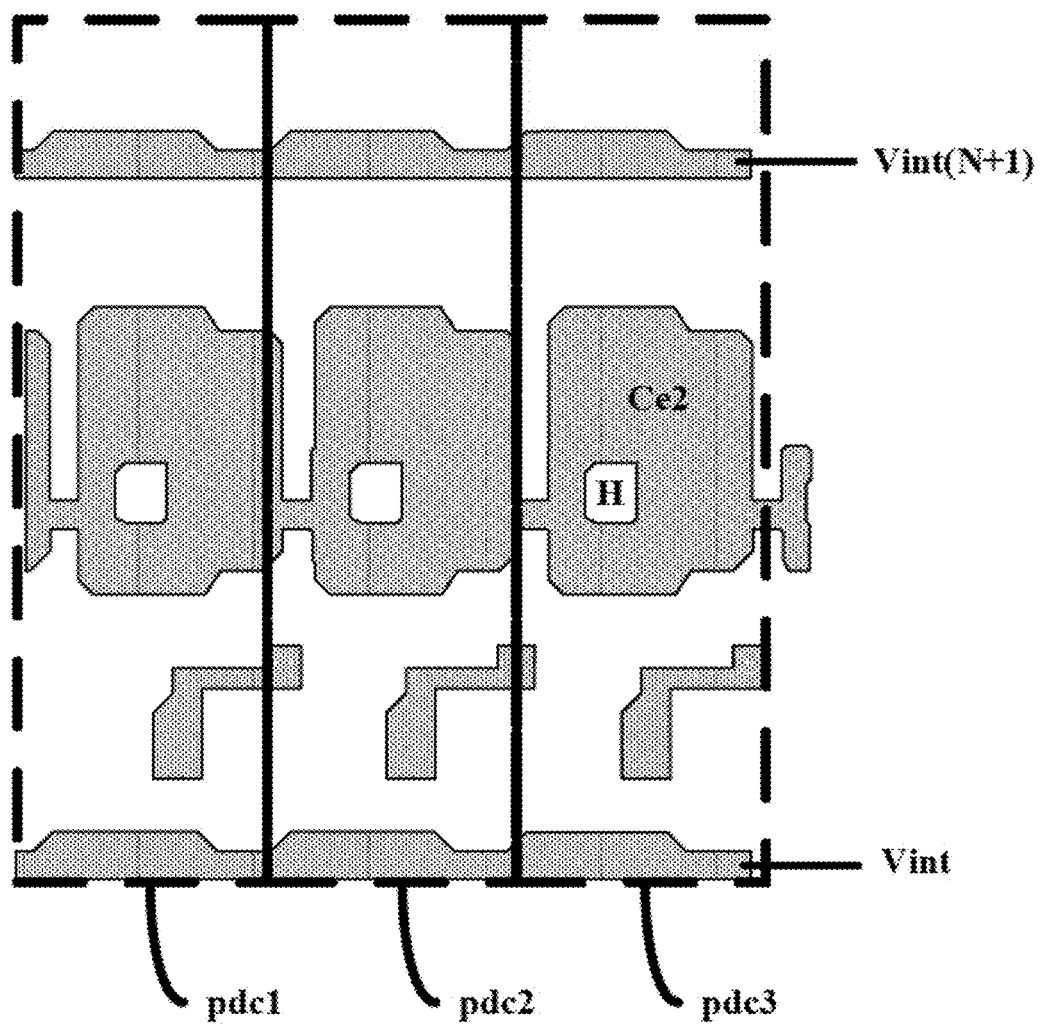
FIG. 6 is a diagram illustrating the structure of a second conductive layer in a plurality of subpixels of an array substrate in some embodiments according to the present disclosure.
Figure 7:
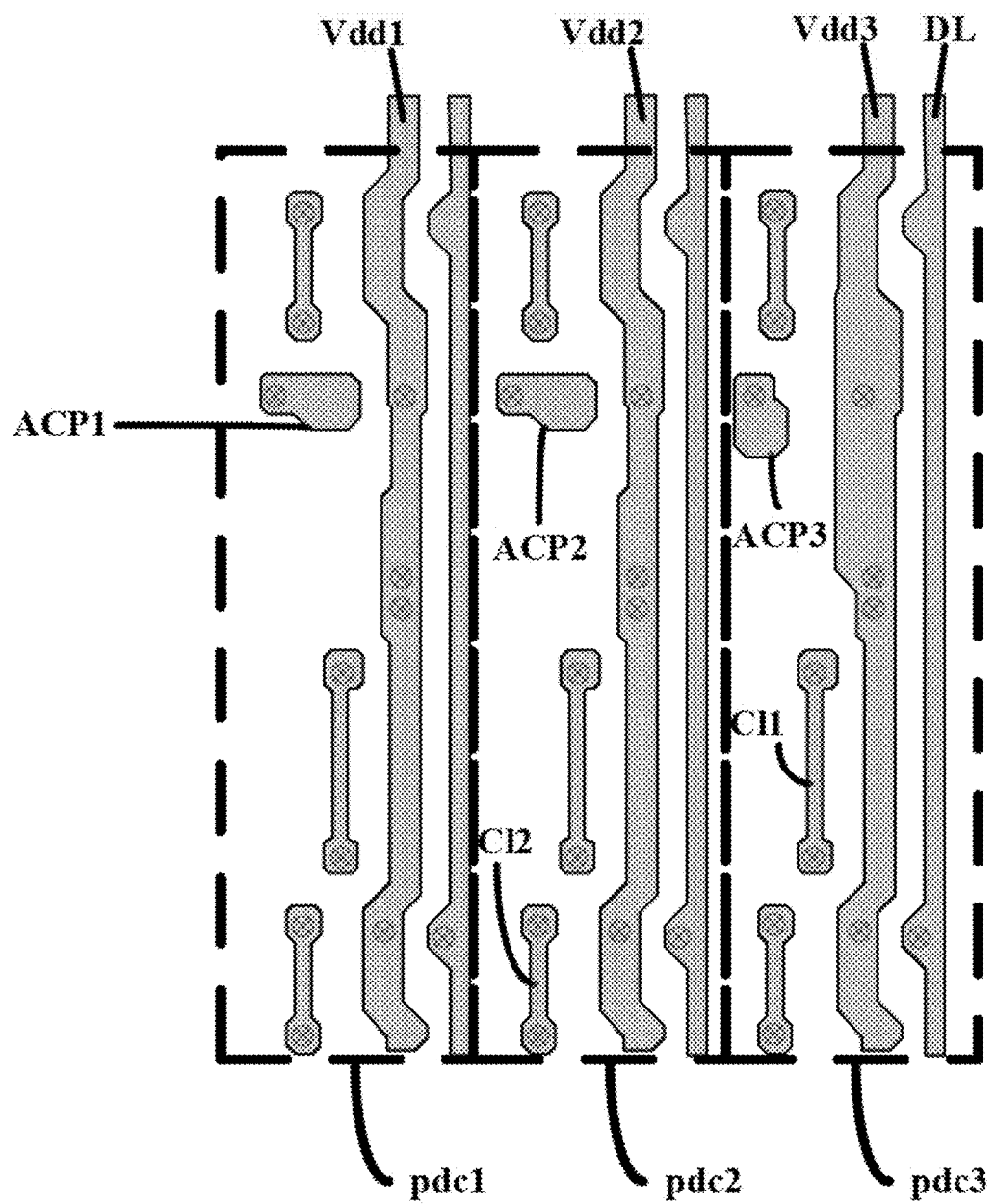
FIG. 7 is a diagram illustrating the structure of a signal line layer in a plurality of subpixels of an array substrate in some embodiments according to the present disclosure.
Figure 8:
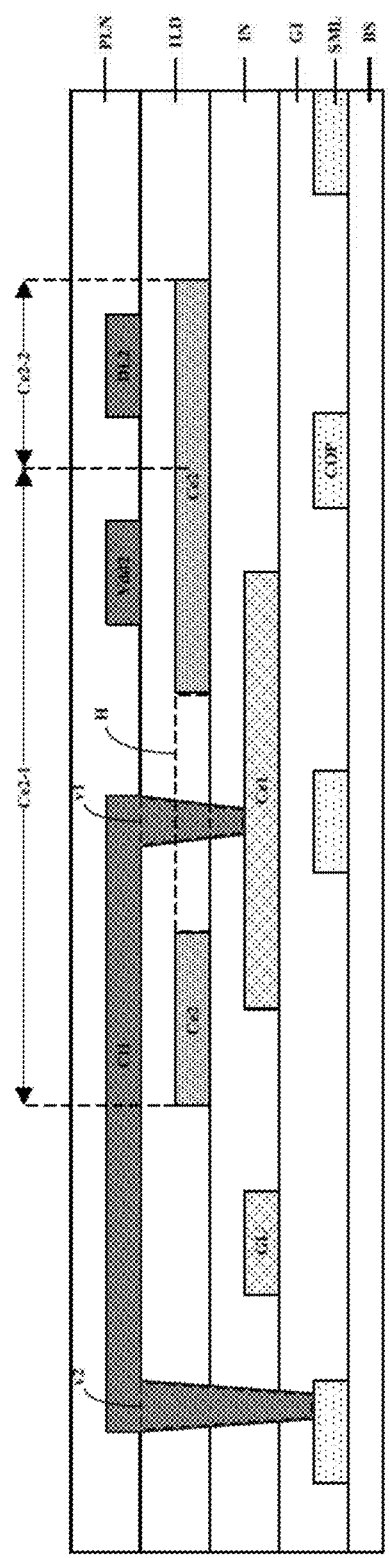
FIG. 8 is a cross-sectional view along an A-A' line in FIG. 3.

FIG. 4 is a diagram illustrating the structure of a semiconductor material layer in a plurality of subpixels of an array substrate in some embodiments according to the present disclosure. FIG. 5 is a diagram illustrating the structure of a first conductive layer in a plurality of subpixels of an array substrate in some embodiments according to the present disclosure. FIG. 6 is a diagram illustrating the structure of a second conductive layer in a plurality of subpixels of an array substrate in some embodiments according to the present disclosure. FIG. 7 is a diagram illustrating the structure of a signal line layer in a plurality of subpixels of an array substrate in some embodiments according to the present disclosure. FIG. 8 is a cross-sectional view along an A-A' line in FIG. 3. Referring to FIG. 3 to FIG. 8, in some embodiments, the array substrate includes a base substrate BS, a semiconductor material layer SML on the base substrate BS, a gate insulating layer GI on a side of the semiconductor material layer SML away from the base substrate BS, a first conductive layer on aside of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, a signal line layer on a side of the inter-layer dielectric layer ILD away from the second conductive layer, and a planarization layer PLN on a side of the signal line layer away from the inter-layer dielectric layer ILD.

Referring to FIG. 3, each of the first pixel driving circuit pdc1, the second pixel driving circuit pdc2, and the third pixel driving circuit pdc3 includes the first transistor T1, the second transistor T2, the third transistor T3, the fourth transistor T4, the fifth transistor T5, the sixth transistor T6, and the driving transistor Td.

Referring to FIG. 2, FIG. 3, and FIG. 5, the first conductive layer in some embodiments includes a gate line GL, a reset control signal line rst, a light emitting control signal line em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the gate line GL, the reset control signal line rst, the light emitting control signal line em, and the first capacitor electrode Ce1 are in a same layer.

As used herein, the term "same layer" refers to the relationship between the layers simultaneously formed in the same step. In one example, the gate line GL and the first capacitor electrode Ce1 are in a same layer when they are formed as a result of one or more steps of a same patterning process performed in a same layer of material. In another example, the gate line GL and the first capacitor electrode Ce1 can be formed in a same layer by simultaneously performing the step of forming the gate line GL, and the step of forming the first capacitor electrode Ce1. The term "same layer" does not always mean that the thickness of the layer or the height of the layer in a cross-sectional view is the same.

Referring to FIG. 2, FIG. 3, and FIG. 6, the second conductive layer in some embodiments includes a reset signal line Vint, and a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the reset signal line Vint and the second capacitor electrode Ce2 are in a same layer.

Referring to FIG. 2, FIG. 3, and FIG. 7, the signal line layer in some embodiments includes a first voltage supply line Vdd1, a second voltage supply line Vdd2, a third voltage supply line Vdd3, a first data line DL1, a second data line DL2, and a third data line DL3, a first anode contact pad ACP1, a second anode contact pad ACP2, a third anode contact pad ACP3, a first connecting line Cl1, and a second connecting line Cl2. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the signal line layer include, but are not limited to, aluminium, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the first voltage supply line Vdd1, the second voltage supply line Vdd2, the third voltage supply line Vdd3, the first data line DL1, the second data line DL2, the third data line DL3, the first anode contact pad ACP1, the second anode contact pad ACP2, the third anode contact pad ACP3, the first connecting line Cl1, and the second connecting line CL2 are in a same layer. As shown in FIG. 7, the data lines (e.g., the first data line DL1, the second data line DL2, the third data line DL3) are substantially straight lines.

Referring to FIG. 2. FIG. 3, FIG. 5, FIG. 6, and FIG. 8, the storage capacitor Cst in some embodiments includes the first capacitor electrode Ce1, the second capacitor electrode Ce2, and the insulating layer IN between the first capacitor electrode Ce1 and the second capacitor electrode Ce2. As shown in FIG. 2, the second capacitor electrode Ce2 is electrically connected to a respective voltage supply line. For example, the second capacitor electrode Ce2 and the respective voltage supply line are configured to be provided with a same voltage at all time.

Referring to FIG. 2, FIG. 3, and FIG. 4, in some embodiments, in each pixel driving circuit, the semiconductor material layer has a unitary structure. In FIG. 4, the pixel driving circuit on the left (the first pixel driving circuit pdc1) is annotated with labels indicating regions corresponding to the plurality of transistors in the pixel driving circuit, including the first transistor T1, the second transistor T2, the third transistor T3, the fourth transistor T4, the fifth transistor T5, the sixth transistor T6, and the driving transistor Td. In FIG. 4, the pixel driving circuit on the left (the third pixel driving circuit pdc3) on the right is annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in a respective subpixel are parts of a unitary structure in the respective subpixel. In another example, the active layers (ACT1, ACT2, ACT3, ACT4, ACT5, ACT6, and ACTd), the source electrodes (S1, S2, S3, S4, S5, S6 and Sd), and the drain electrodes (D1, D2, D3, D4, D5, D6, and Dd) of the transistors (T1, T2, T3, T4, T5, T6, and Td) are in a same layer.

Referring to FIG. 2, FIG. 3, and FIG. 8, in some embodiments, the signal line layer includes a first connecting line Cl1 on a side of the inter-layer dielectric layer ILD away from the second capacitor electrode Ce2. The first connecting line Cl1 is in a same layer as the voltage supply line (e.g., the second voltage supply line Vdd2) and the data line (e.g., the second data line DL2). Optionally, the array substrate further includes a first via v1 in the hole region H and extending through the inter-layer dielectric layer ILD and the insulating layer IN. Optionally, the first connecting line Cl1 is connected to the first capacitor electrode Ce1 through the first via v1.

In some embodiments, the first capacitor electrode Ce1 is on a side of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the first connecting line Cl1 is connected to the first capacitor electrode Ce1 through the first via v1, and is connected to the semiconductor material layer SML through the second via v2.

Figure 9A:
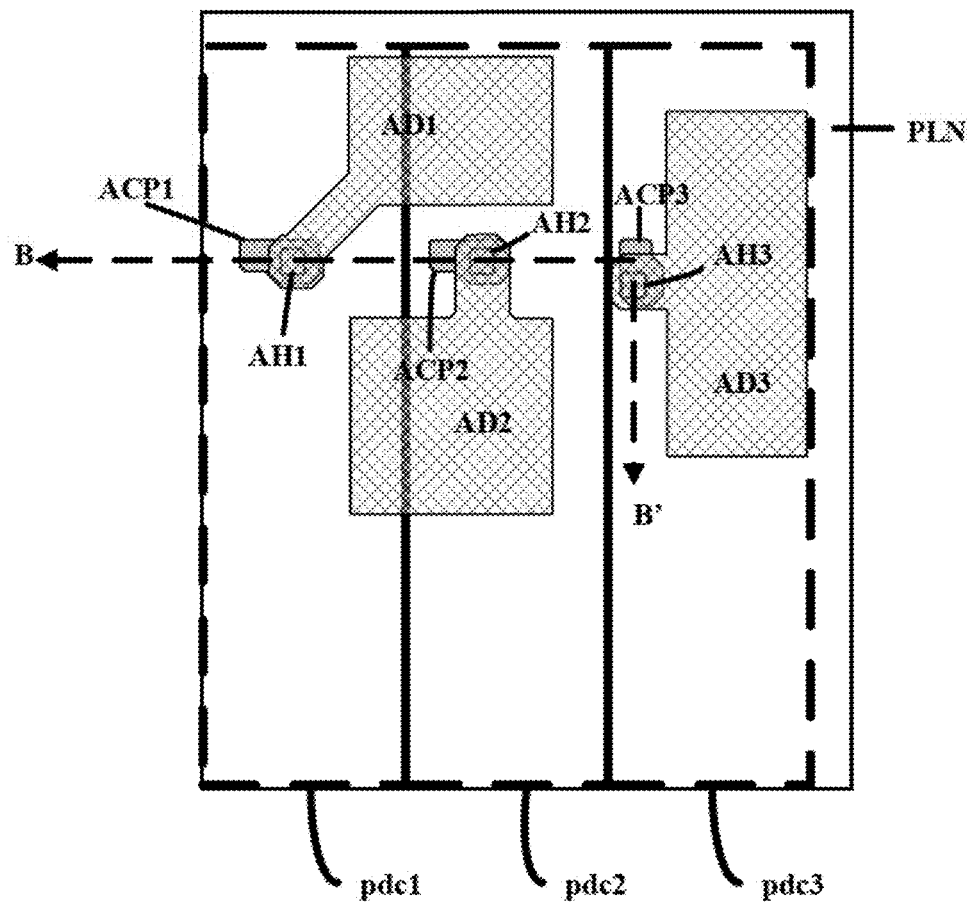
FIG. 9A is a diagram illustrating the structure of a planarization layer and anodes of light emitting elements of an array substrate in some embodiments according to the present disclosure.
Figure 9B:
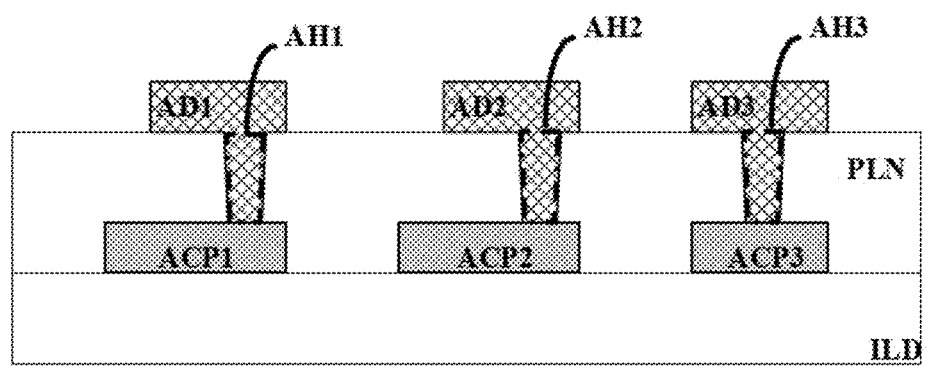
FIG. 9B is a cross-sectional view along a B-B' line in FIG. 9A.

FIG. 9A is a diagram illustrating the structure of a planarization layer and anodes of light emitting elements of an array substrate in some embodiments according to the present disclosure. FIG. 9B is a cross-sectional view along a B-B' line in FIG. 9A. Referring to FIG. 2, FIG. 3, FIG. 7, FIG. 9A, and FIG. 9B, the signal line layer in some embodiments includes a first anode contact pad ACP1, a second anode contact pad ACP2, a third anode contact pad ACP3 respectively on the inter-layer dielectric layer ILD. The array substrate includes a planarization layer PLN on a side of the signal line layer away from the inter-layer dielectric layer ILD; a first anode contact hole AH1, a second anode contact hole AH2, and a third anode contact hole AH3 respectively extending through the planarization layer PLN; and a first anode AD1, a second anode AD2, and a third anode AD3 respectively connected to the first anode contact pad ACP1, the second anode contact pad ACP2, the third anode contact pad ACP3 respectively through the first anode contact hole AH1, the second anode contact hole AH2, and the third anode contact hole AH3. The first anode AD1, the second anode AD2, and the third anode AD3 are respectively anodes of a first light emitting element, a second light emitting element, and a third light emitting element respectively connected to the first pixel driving circuit, the second pixel driving circuit, and the third pixel driving circuit.

Figure 10A:
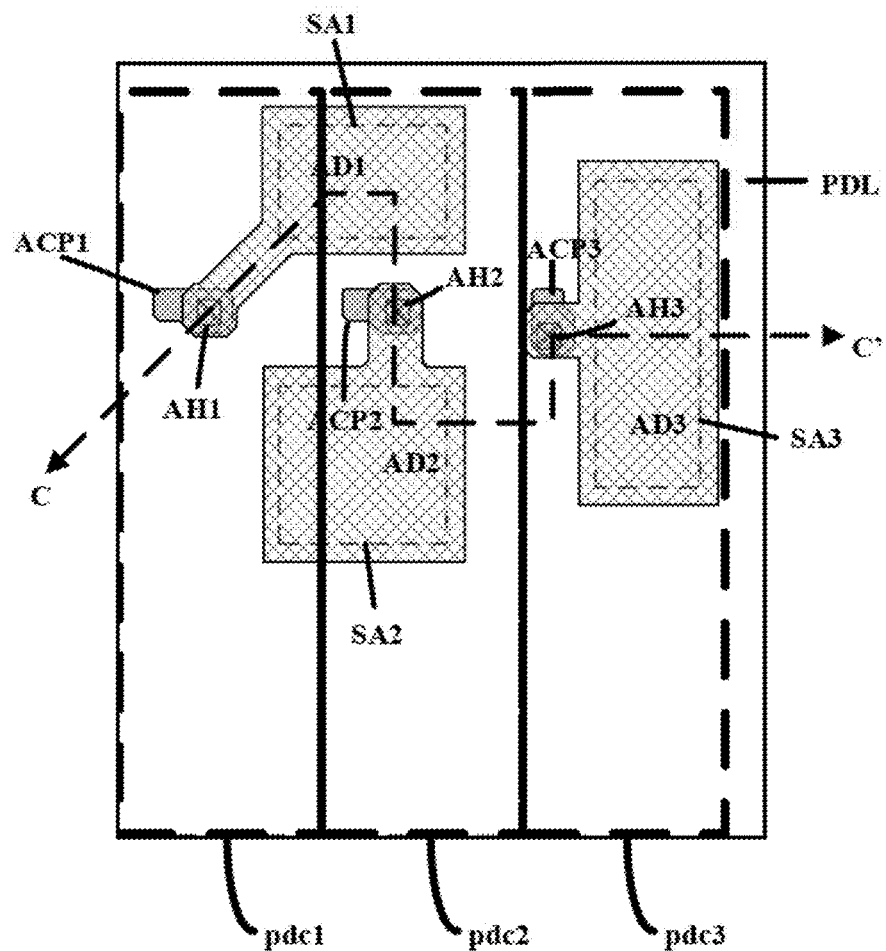
FIG. 10A is a diagram illustrating the structure of a pixel definition layer and anodes of light emitting elements of an array substrate in some embodiments according to the present disclosure.
Figure 10B:
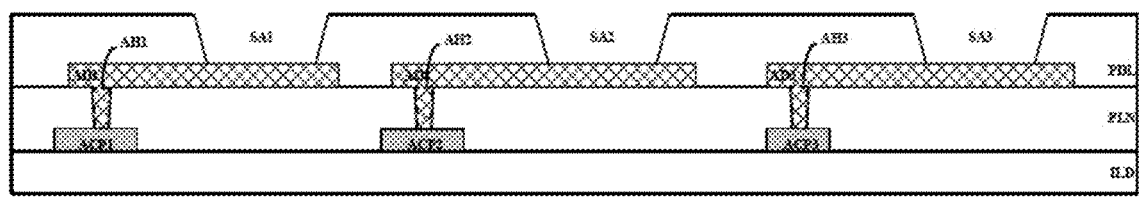
FIG. 10B is a cross-sectional view along a C-C' line in FIG. 10A.

FIG. 10A is a diagram illustrating the structure of a pixel definition layer and anodes of light emitting elements of an array substrate in some embodiments according to the present disclosure. FIG. 10B is a cross-sectional view along a C-C' line in FIG. 10A. Referring to FIG. 2, FIG. 3, FIG. 10A, and FIG. 10B, the array substrate in some embodiments further includes a pixel definition layer PDL on a side of the first anode AD1, the second anode AD2, and the third anode AD3 away from the planarization layer PLN. The array substrate further includes a first subpixel aperture SA1, a second subpixel aperture SA2, and a third subpixel aperture SA3 respectively extending through the pixel definition layer PDL.

Figure 11:
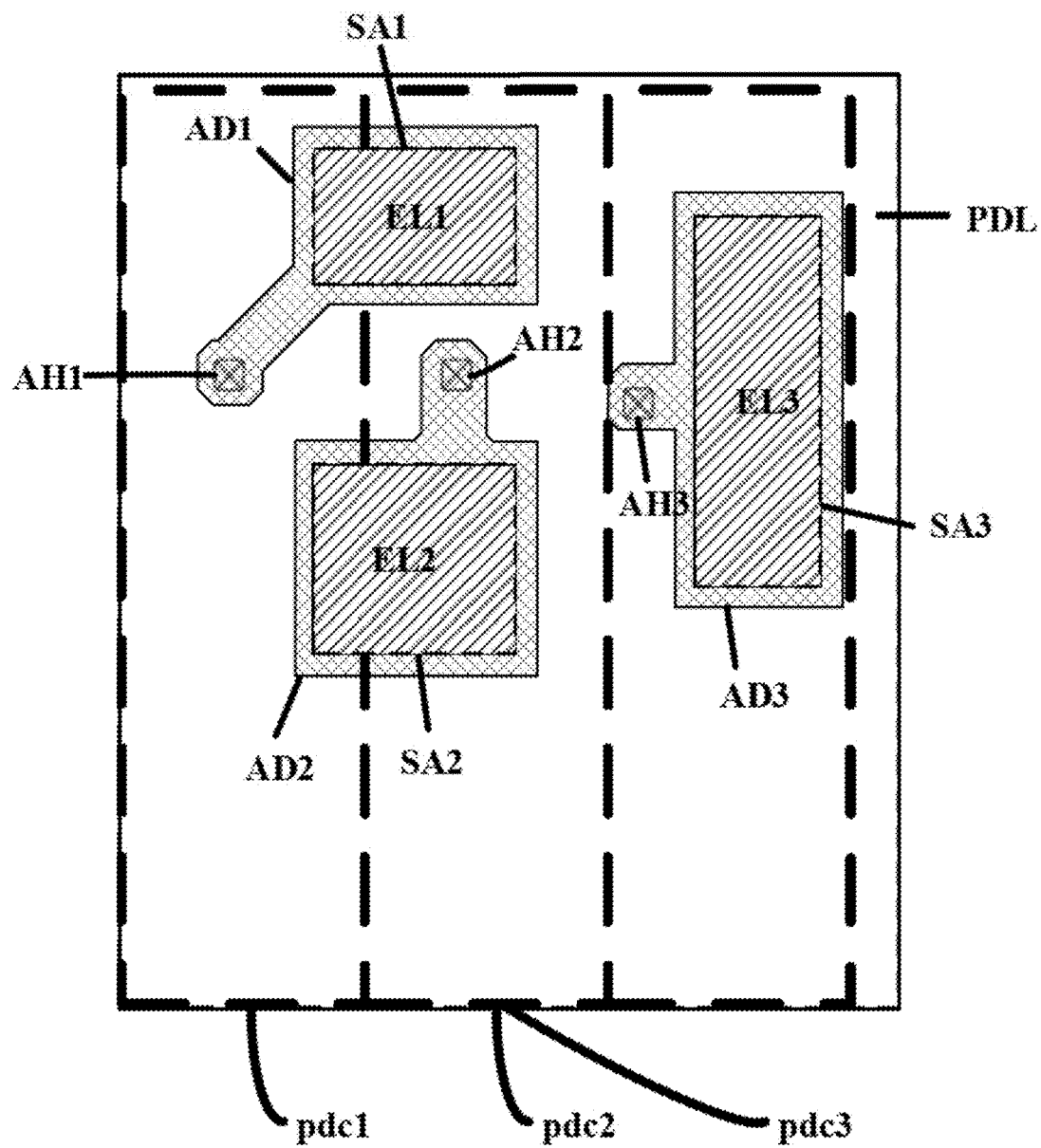
FIG. 11 is a diagram illustrating the structure of a pixel definition layer, and anodes and light emitting layers of light emitting elements of an array substrate in some embodiments according to the present disclosure.

FIG. 11 is a diagram illustrating the structure of a pixel definition layer, and anodes and light emitting layers of light emitting elements of an array substrate in some embodiments according to the present disclosure. Referring to FIG. 2, FIG. 3, and FIG. 11, the array substrate in some embodiments further includes a first light emitting layer EL1, a second light emitting layer EL2, and a third light emitting layer EL respectively in the first subpixel aperture SA1, the second subpixel aperture SA2, and the third subpixel aperture SA3. The first light emitting layer EL1, the second light emitting layer EL2, and the third light emitting layer EL3 are respectively connected to the first anode AD1, the second anode AD2, and the third anode AD3 respectively through the first subpixel aperture SA1, the second subpixel aperture SA2, and the third subpixel aperture SA3. The first light emitting layer EL1, the second light emitting layer EL2, and the third light emitting layer EL are respectively light emitting layers of a first light emitting element, a second light emitting element, and a third light emitting element respectively connected to the first pixel driving circuit, the second pixel driving circuit, and the third pixel driving circuit.

Figure 12:
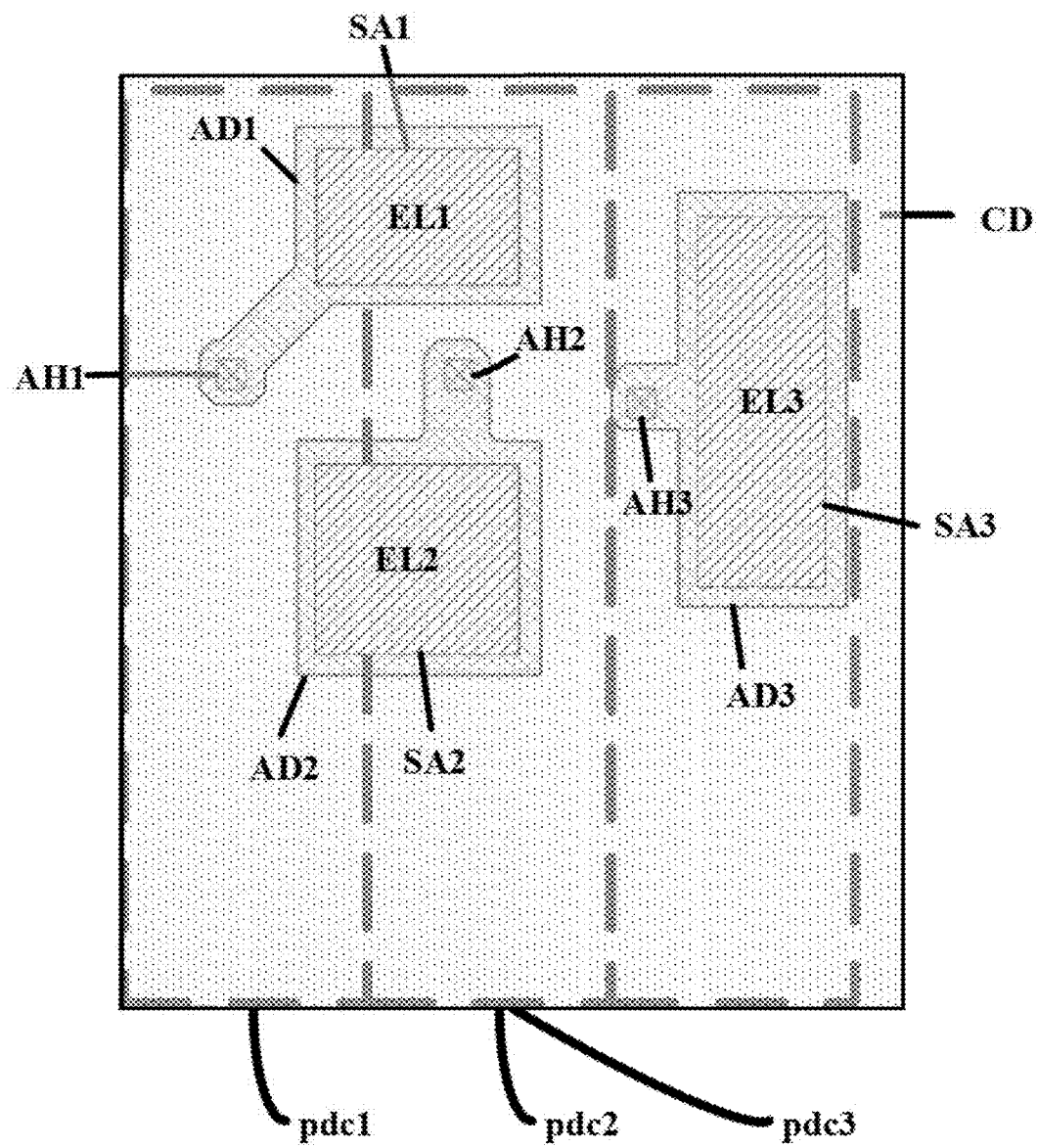
FIG. 12 is a diagram illustrating the structure of a cathode layer, and anodes and light emitting layers of light emitting elements of an array substrate in some embodiments according to the present disclosure.

FIG. 12 is a diagram illustrating the structure of a cathode layer, and anodes and light emitting layers of light emitting elements of an array substrate in some embodiments according to the present disclosure. Referring to FIG. 2, FIG. 3, and FIG. 12, the array substrate in some embodiments further includes a cathode layer CD on a side of the first light emitting layer EL1, the second light emitting layer EL2, and the third light emitting layer EL3 away from the first anode AD1, the second anode AD2, and the third anode AD3. Optionally, the cathode layer CD is a unitary layer for all light emitting elements in the array substrate.

Figure 13A:
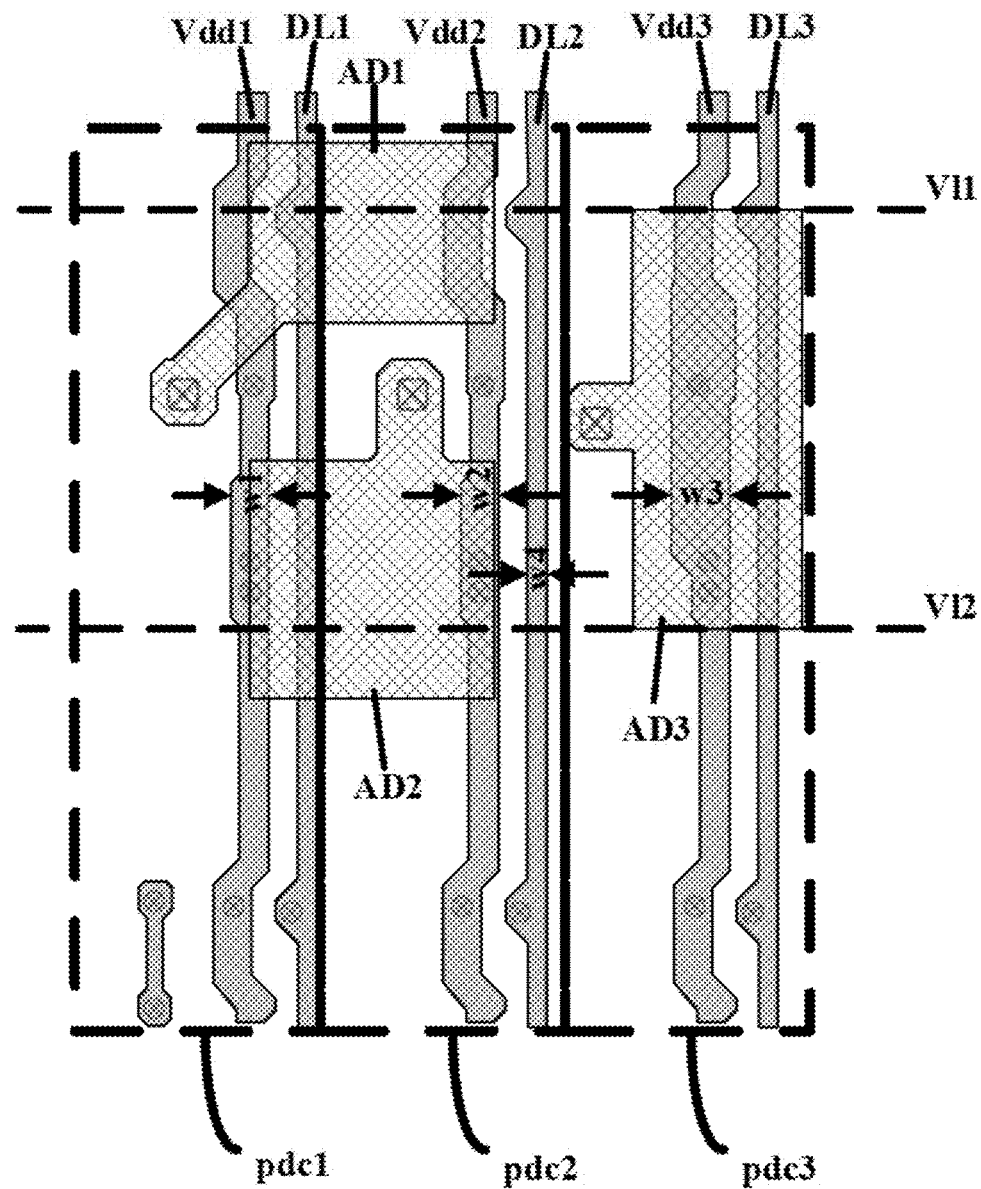
FIG. 13A is a diagram illustrating the structure of a signal line layer, and anodes of light emitting elements of an array substrate in some embodiments according to the present disclosure.
Figure 13B:
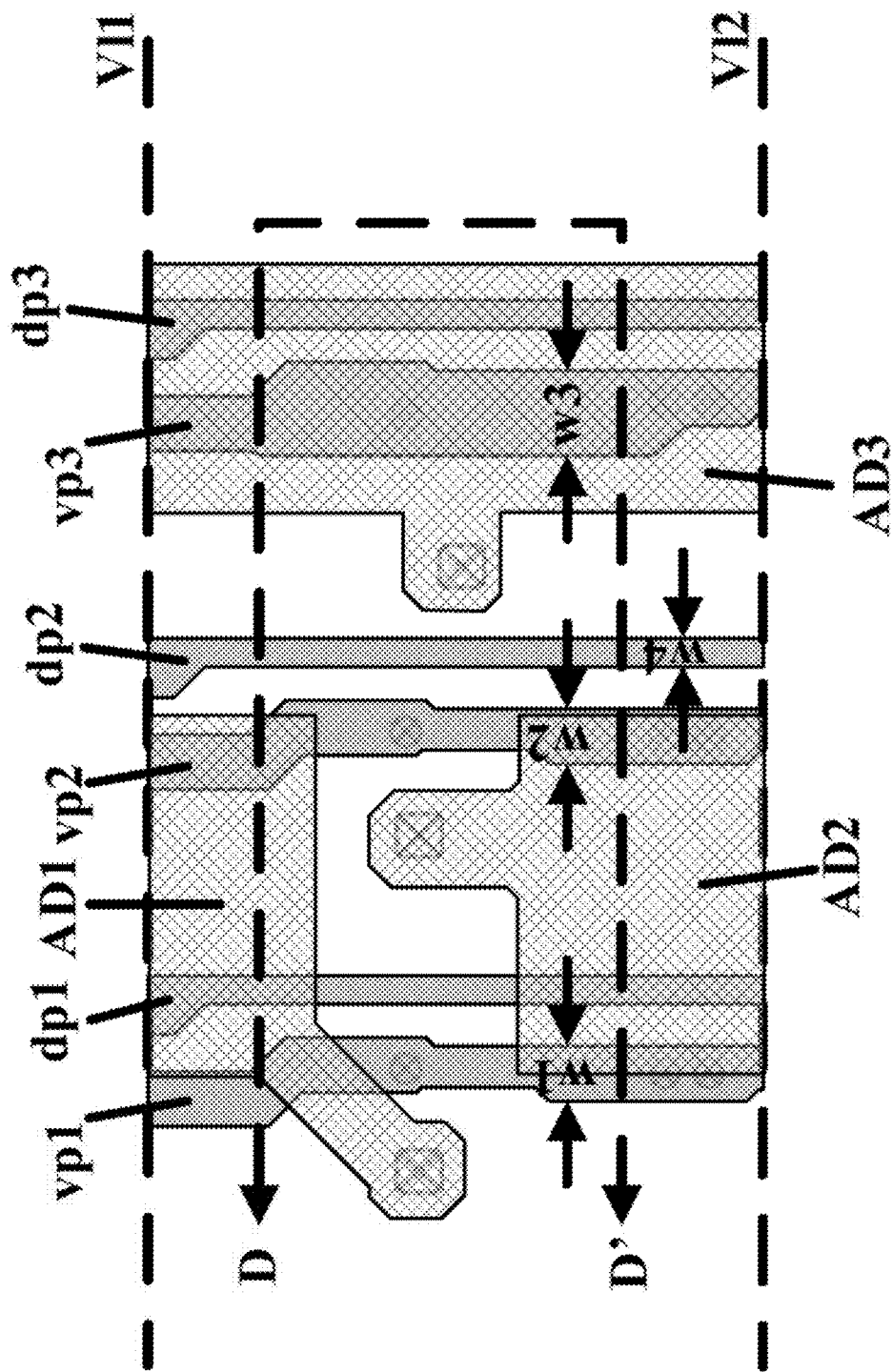
FIG. 13B is a zoom-in view of a region between a first virtual line and a second virtual line in FIG. 13A.

FIG. 13A is a diagram illustrating the structure of a signal line layer, and anodes of light emitting elements of an array substrate in some embodiments according to the present disclosure. Referring to FIG. FIG. 13A, in some embodiments, a first virtual line Vl1 and a second virtual line Vl2 respectively cross over the first voltage supply line Vdd1, the second voltage supply line Vdd2, and the third voltage supply line Vdd3, as well as the first data line DL1, the second data line DL2, and the third data line DL3. FIG. 13B is a zoom-in view of a region between a first virtual line and a second virtual line in FIG. 13A. Referring to FIG. FIG. 13A and FIG. 13B, in some embodiments, the first voltage supply line Vdd1, the second voltage supply line Vdd2, and the third voltage supply line Vdd3 respectively include a first voltage supply line portion vp1, a second voltage supply line portion vp2, and a third voltage supply line portion vp3, respectively between the first virtual line Vl1 and the second virtual line Vl2.

Figure 13C:
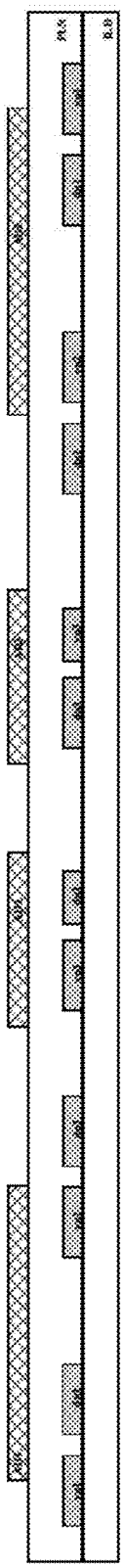
FIG. 13C is a cross-sectional view along a D-D' line in FIG. 13B.

FIG. 13C is a cross-sectional view along a D-D' line in FIG. 13B. Referring to FIG. FIG. 13A, FIG. 13B, and FIG. 13C, in some embodiments, an orthographic projection of a third anode AD3 of the third light emitting element on a base substrate (e.g., the inter-layer dielectric layer ILD) completely covers an orthographic projection of the third voltage supply line portion vp3 on the base substrate. The third voltage supply line portion vp3 has a third line width w3 greater than a first line width w1 of the first voltage supply line portion vp1, and greater than a second line width w2 of the second voltage supply line portion vp2.

Optionally, w1 is in a range of 3 μm to 9 μm, e.g., 3 μm to 4 μm 4 μm to 5 μm, 5 μm to 6 μm, 6 μm to 7 μm, 7 μm to 8 μm, or 8 μm to 9 μm. Optionally, w1 is approximately 5.6 μm. Optionally, w2 is in a range of 3 μm to 9 μm, e.g., 3 μm to 4 μm, 4 μm to 5 μm, 5 μm to 6 μm, 6 μm to 7 μm, 7 µm to 8 µm, or 8 µm to 9 µm. Optionally, w2 is approximately 5.6 µm. Optionally, w3 is in a range of 6 µm to 12 µm, e.g., 6 µm to 7 µm, 7 µm to 8 µm 8 µm to 9 µm, 9 µm to 10 µm, 10 µm to 11 µm, or 11 µm to 12 µm. Optionally, w3 is approximately 9 µm.

Referring to FIG. FIG. 13A, FIG. 13B, and FIG. 13C, in some embodiments, the first data line DLL, the second data line D12, the third data line DL3 respectively include a first data line portion dp1, a second data line portion dp2, a third data line portion dp3, respectively between the first virtual line Vl1 and the second virtual line Vl2. Optionally, the first data line portion dp1, the second data line portion dp2, and the third data line portion dp3 have a substantially same line width w4. As used herein, the term "substantially same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Optionally, w4 is in a range of 1 µm to 5 µm. e.g., 1 µm to 2 µm, 2 µm to 3 µm, 3 µm to 4 µm, or 4 µm to 5 µm. Optionally, w4 is approximately 3 µm.

Optionally, the third line width w3 refers to a maximum line width of the third voltage supply line portion vp3, the first line width w1 refers to a maximum line width of the first voltage supply line portion vp1, the second line width w2 refers to a maximum line width of the second voltage supply line portion vp2, and the line width w4 refers to maximum line widths respectively of the first data line portion dp1, the second data line portion dp2, and the third data line portion dp3.

Optionally, the third line width w3 refers to an average line width of the third voltage supply line portion vp3, the first line width w1 refers to an average line width of the first voltage supply line portion vp1, the second line width w2 refers to an average line width of the second voltage supply line portion vp2, and the line width w4 refers to average line widths respectively of the first data line portion dp1, the second data line portion dp2, and the third data line portion dp3.

Optionally, the third line width w3 refers to a minimum line width of the third voltage supply line portion vp3, the first line width w1 refers to a minimum line width of the first voltage supply line portion vp1, the second line width w2 refers to a minimum line width of the second voltage supply line portion vp2, and the line width w4 refers to minimum line widths respectively of the first data line portion dp1, the second data line portion dp2, and the third data line portion dp3.

Optionally, the third voltage supply line portion vp3 has a third line width w3 greater than a first line width w1 of the first voltage supply line portion vp1, and greater than a second line width w2 of the second voltage supply line portion vp2, when the line widths w1, w2, and w3 are measured along a line parallel to the first virtual line Vl1 and the second virtual line Vl2, and crossing over the first voltage supply line portion vp1, the second voltage supply line portion vp2, and the third voltage supply line portion vp3.

Referring to FIG. 13A, FIG. 13B, and FIG. 13C, in some embodiments, the orthographic projection of the third anode AD3 on the base substrate (e.g., the inter-layer dielectric layer ILD) is at least partially overlapping with an orthographic projection of the third data line portion dp3 on the base substrate. Optionally, the orthographic projection of the third anode AD3 on the base substrate (e.g., the inter-layer dielectric layer ILD) completely covers the orthographic projection of the third data line portion dp3 on the base substrate.

Referring to FIG. 13A, in some embodiments, the first data line DL1, the second data line DL2, the third data line DL3, the first voltage supply line Vdd1, the second voltage supply line Vdd2, and the third voltage supply line Vdd3 are substantially parallel to each other (see, also, FIG. 1, FIG. 3, and FIG. 7). Optionally, data lines (e.g., the first data line DL1, the second data line DL2, and the third data line DL3) and voltage supply lines (e.g., the first voltage supply line Vdd1, the second voltage supply line Vdd2, and the third voltage supply line Vdd3) are alternatively arranged. Optionally, the first data line portion dp1, the second data line portion dp2, the third data line portion dp3, the first voltage supply line portion vp1, the second voltage supply line portion vp2, and the third voltage supply line portion vp3 are substantially parallel to each other. Optionally, data line portions (e.g., the first data line portion dp1, the second data line portion dp2, and the third data line portion dp3) and voltage supply line portions (e.g., the first voltage supply line portion vp1, the second voltage supply line portion vp2, and the third voltage supply line portion vp3) are alternatively arranged. As used herein, the term "substantially parallel" means that an included angle between two signal lines is in the range of 0 degree to approximately 25 degrees, e.g., 0 degree to approximately 5 degrees, 0 degree to approximately 10 degrees, 0 degree to approximately 15 degrees, or 0 degree to approximately 20 degrees.

Figure 14:
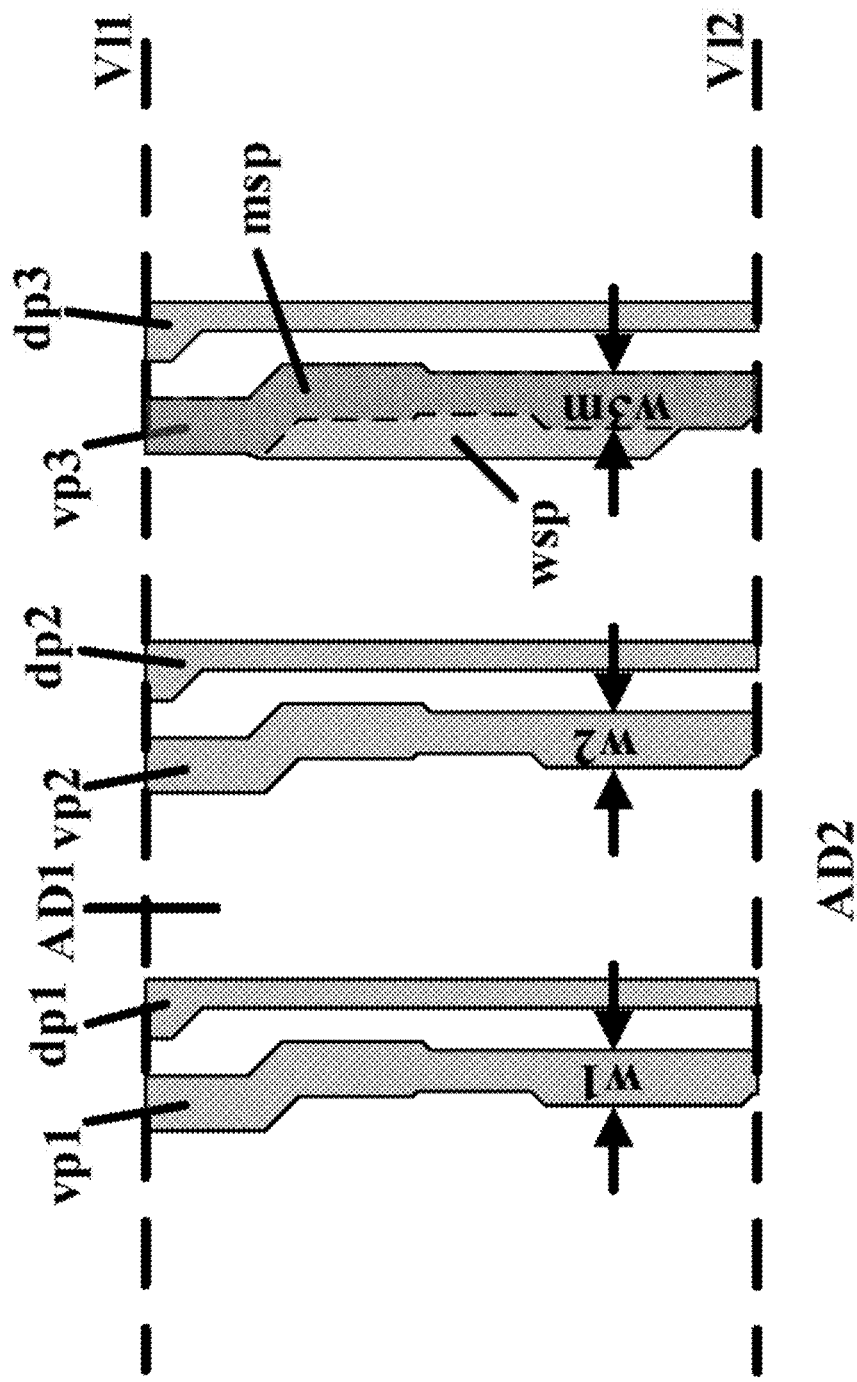
FIG. 14 illustrates the structure of voltage supply line portions in an array substrate in some embodiments according to the present disclosure.

FIG. 14 illustrates the structure of voltage supply line portions in an array substrate in some embodiments according to the present disclosure. Referring to FIG. 14, in some embodiments, the third voltage supply line portion vp3 includes a main sub-portion msp and a widening sub-portion wsp. The main sub-portion msp is between the widening sub-portion wsp and the third data line portion dp3, thus the main sub-portion msp is between the widening sub-portion wsp and the third data line. As shown in FIG. 14, in one example, the main sub-portion msp, the first voltage supply line portion vp1, and the second voltage supply line portion vp2 have a same shape and a substantially same dimension. The difference between the third voltage supply line portion vp3 and the first voltage supply line portion vp1 or the second voltage supply line portion vp2 is the widening sub-portion wsp, which makes the line width of the third voltage supply line portion vp3 greater than those of the first voltage supply line portion vp1 and the second voltage supply line portion vp2. The main sub-portion msp, the first voltage supply line portion vp1, the second voltage supply line portion vp2 have a same line width. Referring to FIG. 14, the main sub-portion msp has a line width w3m, which equals to w1 or w2.

Optionally, the main sub-portion msp, the first voltage supply line portion vp1, the second voltage supply line portion vp2 have a same line width when the line widths are measured along a line parallel to the first virtual line Vl1 and the second virtual line Vl2, and crossing over the first voltage supply line portion vp1, the second voltage supply line portion vp2, and the main sub-portion msp.

Referring to FIG. 13A, in some embodiments, the first anode AD1 of the first light emitting element is between the first voltage supply line Vdd1 and the second data line DL2; and the second anode AD2 of the second light emitting element is between the first voltage supply line Vdd1 and the second data line DL2. Referring to FIG. 13C, an orthographic projection of the first anode AD1 on a base substrate (e.g., the inter-layer dielectric layer ILD) at least partially overlaps with an orthographic projection of the first data line DL1 (e.g., the first data line portion dp1) on the base substrate and at least partially overlaps with an orthographic projection of the second voltage supply line Vdd2 (e.g., the second voltage supply line portion vp2) on the base substrate. An orthographic projection of the second anode AD2 on the base substrate at least partially overlaps with an orthographic projection of the first data line DL1 (e.g., the first data line portion dp1) on the base substrate and at least partially overlaps with an orthographic projection of the second voltage supply line Vdd2 (e.g., the second voltage supply line portion vp2) on the base substrate.

Optionally, the orthographic projection of the first anode AD1 on a base substrate (e.g., the inter-layer dielectric layer ILD) covers an orthographic projection of a first portion of the first data line DL1 (e.g., the first data line portion dp1) on the base substrate and covers an orthographic projection of a second portion of the second voltage supply line Vdd2 (e.g., the second voltage supply line portion vp2) on the base substrate. Optionally, the orthographic projection of the second anode AD2 on the base substrate covers an orthographic projection of a third portion of the first data line DL1 (e.g., the first data line portion dp1) on the base substrate and covers an orthographic projection of a fourth portion of the second voltage supply line Vdd2 (e.g., the second voltage supply line portion vp2) on the base substrate.

In some embodiments, the orthographic projection of the first anode AD1 on the base substrate further at least partially overlaps with an orthographic projection of the first voltage supply line Vdd1 (e.g., the first voltage supply line portion vp1) on the base substrate; and the orthographic projection of the second anode AD2 on the base substrate at least partially overlaps with an orthographic projection of the first voltage supply line Vdd1 (e.g., the first voltage supply line portion vp1) on the base substrate.

Optionally, the orthographic projection of the first anode AD1 on the base substrate further covers an orthographic projection of a fifth portion of the first voltage supply line Vdd1 (e.g., the first voltage supply line portion vp1) on the base substrate; and the orthographic projection of the second anode AD2 on the base substrate covers an orthographic projection of a sixth portion of the first voltage supply line Vdd1 (e.g., the first voltage supply line portion vp1) on the base substrate.

Referring to FIG. 3, FIG. 9A, FIG. 9B, FIG. 10A, FIG. 10B, FIG. 11, and FIG. 12, in some embodiments, the array substrate includes a first anode contact pad ACP1, a second anode contact pad ACP2, and a third anode contact pad ACP3; a planarization layer PLN on a side of the first anode contact pad ACP1, the second anode contact pad ACP2, and the third anode contact pad ACP3 away from a base substrate (the inter-layer dielectric layer ILD); a first anode contact hole AH1, a second anode contact hole AH2, a third anode contact hole AH3 respectively extending through the planarization layer PLN; a pixel definition layer PDL on a side of the first anode AD1, the second anode AD2, and the third anode AD3 away from the planarization layer PLN; a first subpixel aperture SA1, a second subpixel aperture SA2, and a third subpixel aperture SA3 respectively extending through the pixel definition layer PDL; and a first light emitting layer EL1, a second light emitting layer EL2, and a third light emitting layer EL3 on a side of the pixel definition layer PDL away from the base substrate. The first anode AD1, the second anode AD2, and the third anode AD3 are respectively connected to the first anode contact pad ACP1, the second anode contact pad ACP2, and the third anode contact pad ACP3, respectively through the first anode contact hole AH1, the second anode contact hole AH2, and the third anode contact hole AH3. The first light emitting layer EL1, the second light emitting layer El2, and the third light emitting layer EL3 are respectively connected to the first anode AD1, the second anode AD2, and the third anode AD3, respectively through the first subpixel aperture SA1, the second subpixel aperture SA2, and the third subpixel aperture SA3.

Referring to FIG. 11, in some embodiments, the first anode contact hole AH1 is outside a region having the first subpixel aperture SA1; the second anode contact hole AH2 is outside a region having the second subpixel aperture SA2; and the third anode contact hole AH3 is outside a region having the third subpixel aperture SA3.

Figure 15:
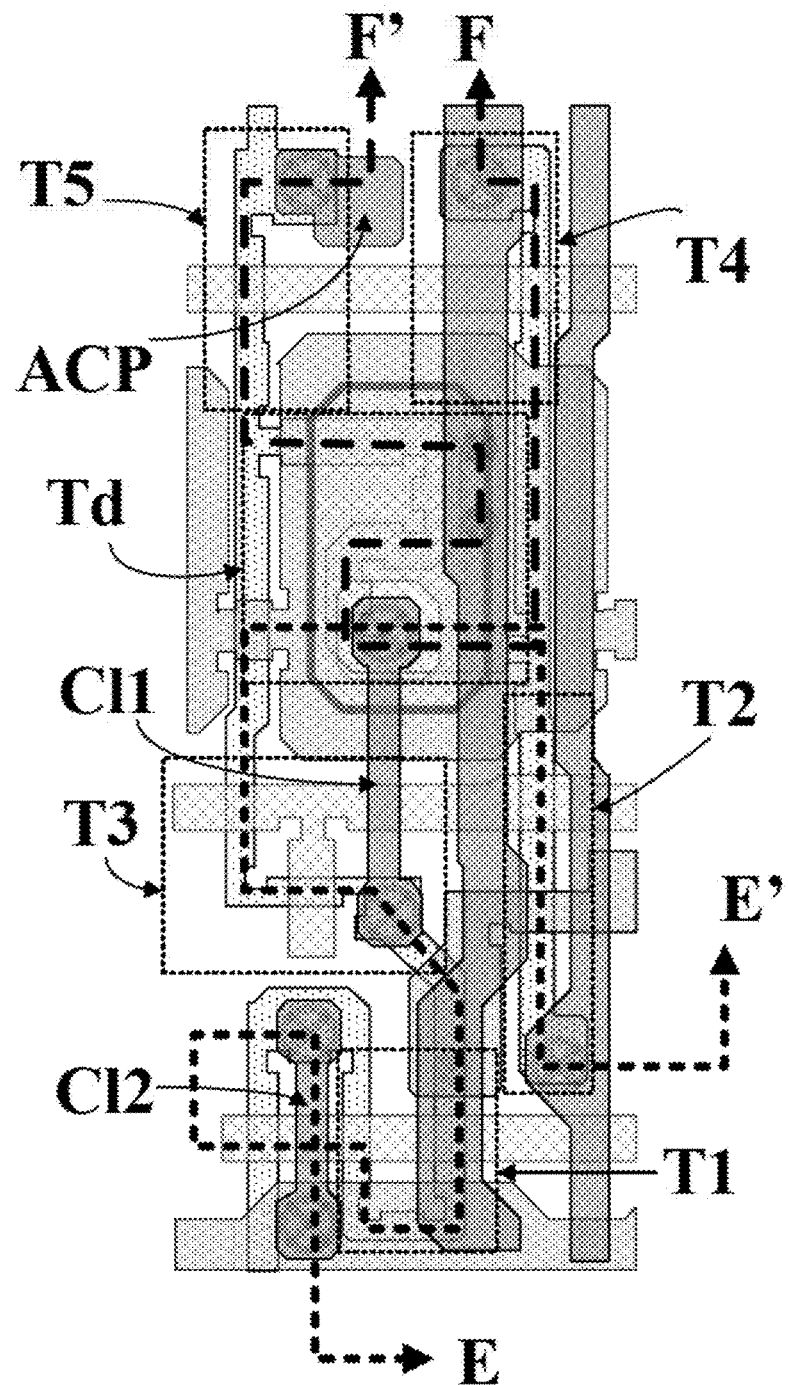
FIG. 15 is a diagram illustrating the structure of a first pixel driving circuit of an array substrate in some embodiments according to the present disclosure.
Figures 16, 17:
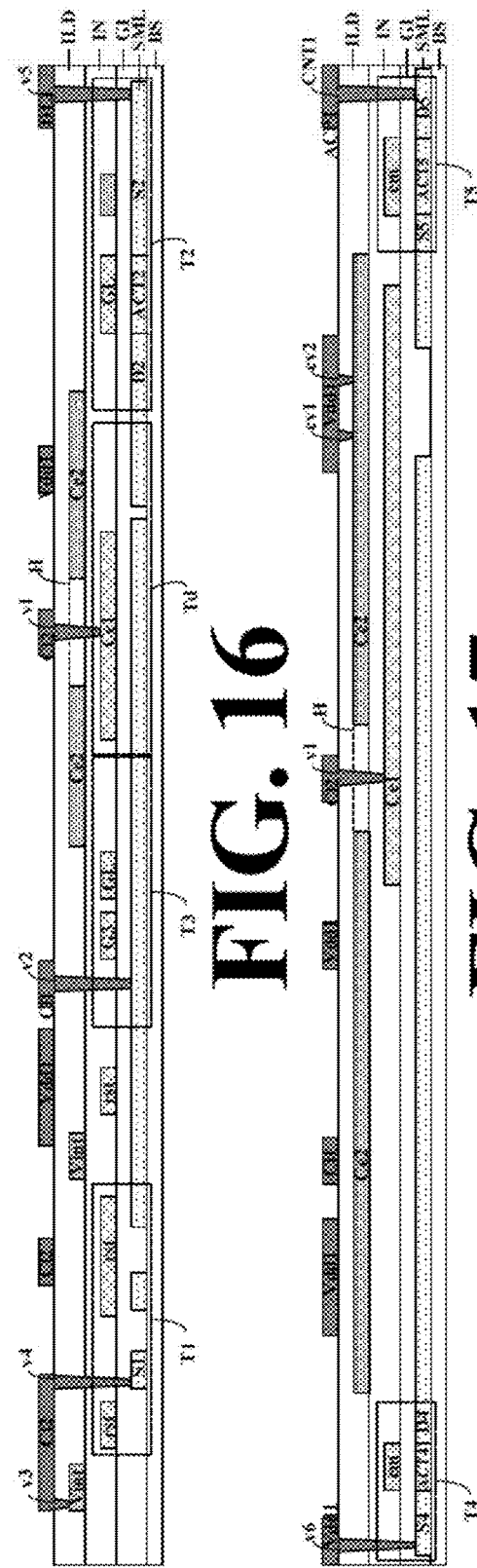
FIG. 16 is a cross-sectional view along an E-E' line in FIG. 15.
FIG. 17 is a cross-sectional view along an F-F' line in FIG. 15.

FIG. 15 is a diagram illustrating the structure of a first pixel driving circuit of an array substrate in some embodiments according to the present disclosure. FIG. 16 is a cross-sectional view along an E-E' line in FIG. 15. FIG. 17 is a cross-sectional view along an F-F' line in FIG. 15. Referring to FIG. 3, FIG. 7, FIG. 15, FIG. 16, and FIG. 17, in some embodiments, the array substrate further includes a connecting via (e.g., a first connecting via cv1 or a second connecting via cv2) extending through the inter-layer dielectric layer ILD. Optionally, the voltage supply line (e.g., the first voltage supply line Vdd1) is connected to the first portion Ce2-1 of the second capacitor electrode Ce2 through the connecting via (e.g., through both the first connecting via cv1 and the second connecting via cv2). In some embodiments, the second capacitor electrode Ce2 is configured to be provided with a high voltage signal through the voltage supply line (e.g., the first voltage supply line Vdd1), as shown in the circuit diagram of FIG. 2.

Referring to FIG. 3, FIG. 7, FIG. 15, FIG. 16, and FIG. 17, the signal line layer in some embodiments further includes a first connecting line Cl1 and a second connecting line Cl2. Optionally, the second connecting line Cl2 is on a side of the inter-layer dielectric layer ILD away from the second capacitor electrode Ce2. Optionally, the second connecting line Cl2 is in a same layer as the voltage supply line (e.g., the first voltage supply line Vdd1) and the data line (e.g., the first data line DL1). The second conductive layer in some embodiments includes a second capacitor electrode Ce2 and a reset signal line Vint. Referring to FIG. 15, FIG. 16, and FIG. 17, the array substrate in some embodiments includes a third via v3. The third via v3 extends through the inter-layer dielectric layer ILD. The second connecting line Cl2 is connected to the reset signal line Vint through the third via v3. Optionally, the array substrate further includes a fourth via v4 extending through the inter-layer dielectric layer ILD, the insulating layer N. and the gate insulating layer GI. The second connecting line Cl2 is connected to the semiconductor material layer SML through the forth via v4.

Referring to FIG. 3, FIG. 4, and FIG. 16, in some embodiments, a source electrode S1 of the first transistor T1 and an active layer ACT1 of the first transistor T1 are parts of a unitary structure in the respective subpixel. The second connecting line Cl2 is connected to the source electrode S1 of the first transistor T1 through the fourth via v4. Referring to FIG. 2 and FIG. 16, a reset signal can be provided from the reset signal line Vint to the source electrode S1 of the first transistor T1 through the second connecting line Cl2.

Referring to FIG. 3. FIG. 7, FIG. 9, FIG. 15, and FIG. 16, the array substrate in some embodiments includes a fifth via v5 extending through the inter-layer dielectric layer ILD, the insulating layer IN, and the gate insulating layer GI. The data line (e.g., the first data line DL1) is connected to the semiconductor material layer SML through the fifth via v5.

Referring to FIG. 3, FIG. 4, and FIG. 16, in some embodiments, a source electrode S2 of the second transistor T2, an active layer ACT2 of the second transistor T2, and a drain electrode D2 of the second transistor T2 are parts of a unitary structure in the respective subpixel. The data line (e.g., the first data line DL1) is connected to the source electrode S2 of the second transistor T2 through the fifth via v5. Referring to FIG. 2 and FIG. 16, a data signal can be provided from the data line (e.g., the first data line DL1) to the source electrode S2 of the second transistor T2 through the fifth via v5.

Referring to FIG. 3, FIG. 7, FIG. 15, and FIG. 17, the array substrate in some embodiments includes a sixth via v6 extending through the inter-layer dielectric layer ILD, the insulating layer IN, and the gate insulating layer GI. The voltage supply line (e.g., the first voltage supple line Vdd1) is connected to the semiconductor material layer SML through the sixth via v6. Referring to FIG. 3, FIG. 4, and FIG. 17, in some embodiments, a source electrode S4 of the fourth transistor T4, an active layer ACT4 of the fourth transistor T4, and a drain electrode D4 of the fourth transistor T4 are parts of a unitary structure in the respective subpixel. The voltage supply line (e.g., the first voltage supple line Vdd1) is connected to the source electrode S4 of the fourth transistor T4 through the sixth via v6. Referring to FIG. 2 and FIG. 16, a high voltage signal can be provided from the voltage supply line (e.g., the first voltage supple line Vdd1) to the source electrode S4 of the fourth transistor T4 through the sixth via v6.

Referring to FIG. 3, FIG. 7, FIG. 15, and FIG. 17, the array substrate in some embodiments includes a pad contact via (e.g., a first pad contact via CNT1) extending through the inter-layer dielectric layer ILD, the insulating layer IN, and the gate insulating layer GI. An anode contact pad (e.g., the first anode contact pad ACP1) is connected to the semiconductor material layer SML through the pad contact via (e.g., the first pad contact via CNT1). Referring to FIG. 3, FIG. 4, and FIG. 17, in some embodiments, a source electrode S5 of the fifth transistor T5, an active layer ACT5 of the fifth transistor T5, and a drain electrode D5 of the fifth transistor T5 are parts of a unitary structure in the respective subpixel. The anode contact pad (e.g., the first anode contact pad ACP1) is connected to the drain electrode D5 of the fifth transistor T5 through the pad contact via (e.g., the first pad contact via CNT1). Referring to FIG. 2 and FIG. 16, a voltage signal is provided from the drain electrode D5 of the fifth transistor T5 to an anode (e.g., the first anode AD1) of the light emitting element through the anode contact pad (e.g., the first anode contact pad ACP1) for driving light emission of the light emitting element.

In some embodiments, the array substrate further includes at least one insulating layer between the base substrate and the first anode contact pad, the second anode contact pad, and the third anode contact pad. Referring to FIG. 3, FIG. 9A, FIG. 9B, FIG. 10A, FIG. 10B, FIG. 11, FIG. 12, and FIG. 17, in some embodiments, the array substrate includes an gate insulating layer GI, an insulating layer IN, an inter-layer dielectric layer ILD between the base substrate BS and the first anode contact pad ACP1, the second anode contact pad ACP2, and the third anode contact pad ACP3.

Figure 18:
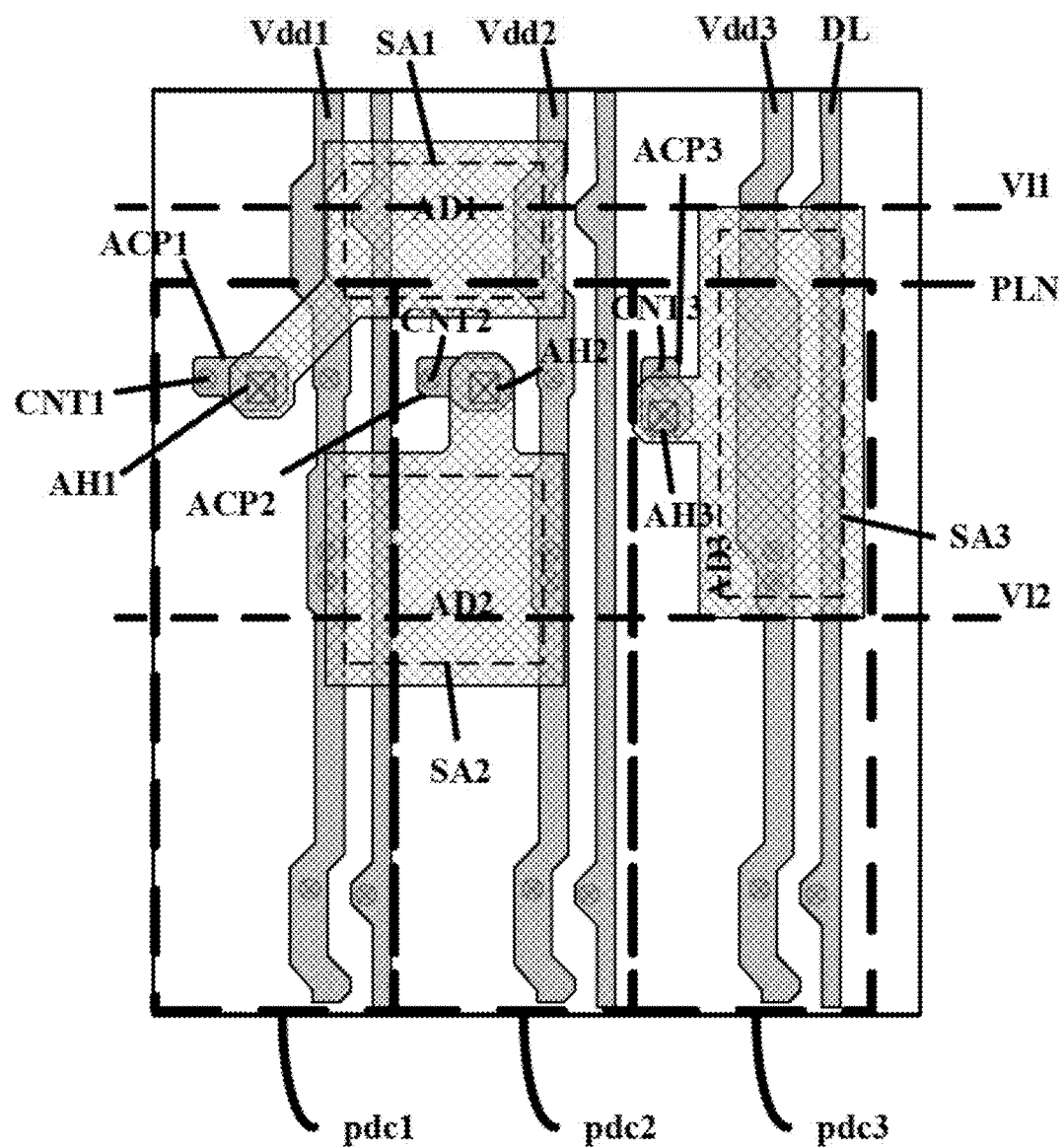
FIG. 18 is a diagram illustrating connection of anodes and anode contact pads in an array substrate in some embodiments according to the present disclosure.

FIG. 18 is a diagram illustrating connection of anodes and anode contact pads in an array substrate in some embodiments according to the present disclosure. Referring to FIG. 18 and FIG. 17, the array substrate includes a first pad contact via CNT1, a second pad contact via CNT2, and a third pad contact via CNT3 respectively extending through the gate insulating layer GI, the insulating layer IN, the inter-layer dielectric layer ILD. The first anode contact pad ACP1, the second anode contact pad ACP2, and the third anode contact pad ACP3 are respectively connected to the first pixel driving circuit pdc1, the second pixel driving circuit pdc2, and the third pixel driving circuit pdc3, respectively through the first pad contact via CNT1, the second pad contact via CNT2, and the third pad contact via CNT3.

Referring to FIG. 18, along a direction of the first virtual line Vl1 or the second virtual line Vl2, the first anode contact hole AH1 is between the first pad contact via CNT1 and the first voltage supply line Vdd1. Along the direction of the first virtual line Vl1 or the second virtual line Vl2, the second anode contact hole AH2 is between the second pad contact via CNT2 and the second voltage supply line Vdd2. In one example, the third pad contact via CNT3 and the third anode contact hole AH3 are arranged along a direction substantially parallel to the third data line DL3 and the third voltage supply line Vdd3.

Figure 19:
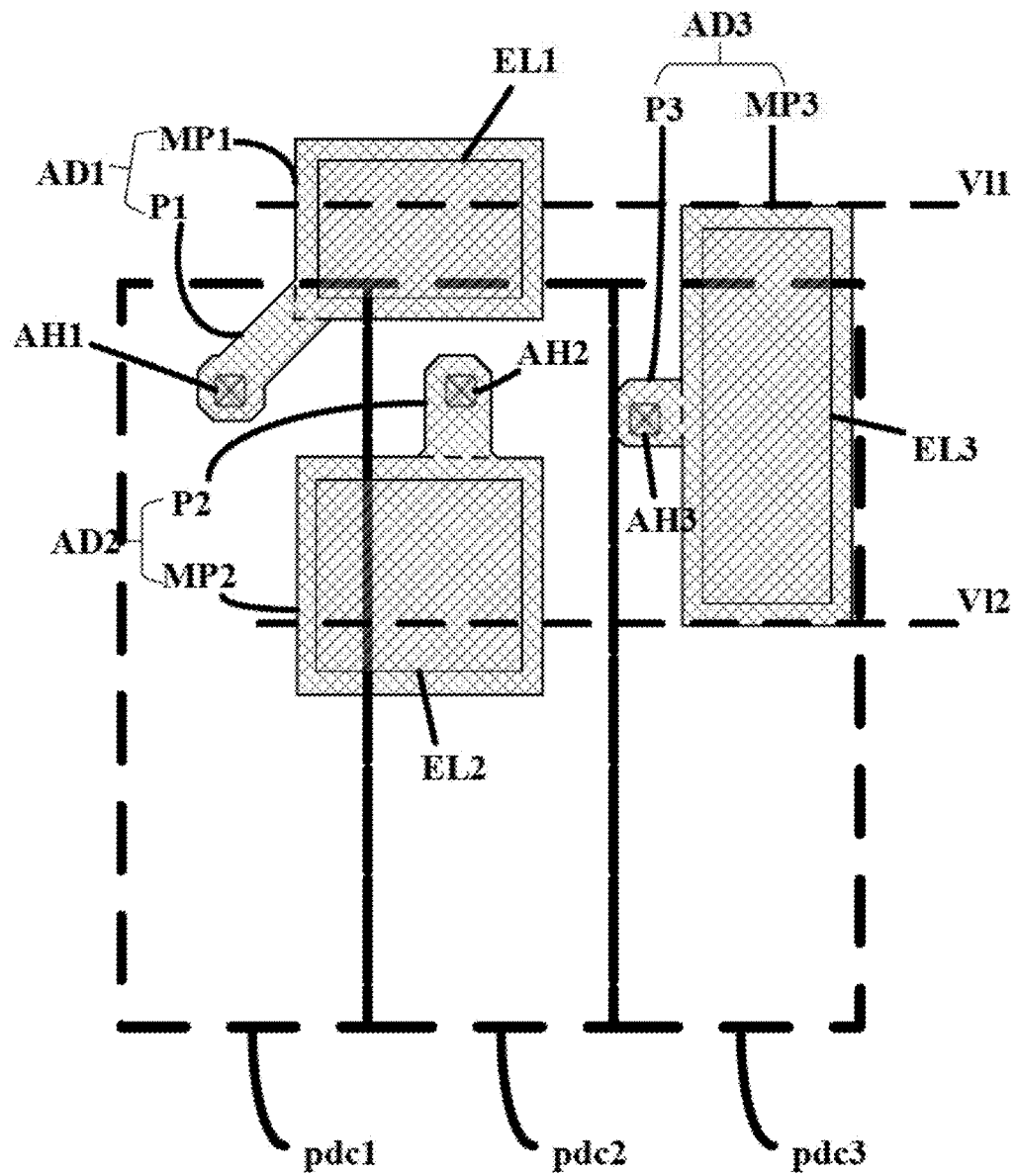
FIG. 19 is a diagram illustrating the structure of anodes of light emitting elements of an array substrate in some embodiments according to the present disclosure.

FIG. 19 is a diagram illustrating the structure of anodes of light emitting elements of an array substrate in some embodiments according to the present disclosure. Referring to FIG. 19, in some embodiments, the first anode AD1 includes a first main portion MP1 and a first bridge portion P1; the second anode AD2 includes a second main portion MP2 and a second bridge portion P2; and the third anode AD3 includes a third main portion MP3 and a third bridge portion P3. In one example, the first main portion MP1, the second main portion MP2, and the third main portion MP3 have a substantially rectangular shape. As used herein, the term "substantially rectangular" refers to a polygonal shape (e.g., a parallelogram) in which the opposing sides are substantially parallel and the corner angles are substantially 90 degrees. As used herein, the term "opposing sides are substantially parallel" refers to two opposing sides forming an included angle in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, and approximately 10 degree to approximately 15 degrees. Optionally, the corner angles of the substantially rectangular shape is in a range of approximately 75 degrees to approximately 105 degrees, e.g., approximately 89 degrees to approximately 91 degrees, approximately 88 degrees to approximately 92 degrees, approximately 85 degrees to approximately 95 degrees, and approximately 80 degrees to approximately 100 degrees In some embodiments, the first bridge portion P1, the second bridge portion P2, and the third bridge portion P3 respectively protruding outward from the first main portion MP, the second main portion MP2, and the third main portion MP3. Referring to FIG. 17. FIG. 18, and FIG. 10B, the first bridge portion P1, the second bridge portion P2, and the third bridge portion P3 are respectively connected to the first anode contact pad ACP1, the second anode contact pad ACP2, and the third anode contact pad ACP3, respectively through the first anode contact hole AH1, the second anode contact hole AH2, and the third anode contact hole AH3. In one example as shown in FIG. 18 and FIG. 19, the third bridge portion P3 protrudes outward from the third main portion MP3 along a direction substantially parallel to the first virtual line Vl1 or the second virtual line Vl2. The second bridge portion P2 protrudes outward from the second main portion MP2 along a direction substantially parallel to the second data line DL2 or the second voltage supply line Vdd2. The first bridge portion P1 protrudes outward from the first main portion MP1 along a direction at an angle oblique to the first virtual line Vl1 and to the first data line DL1.

Figure 20:
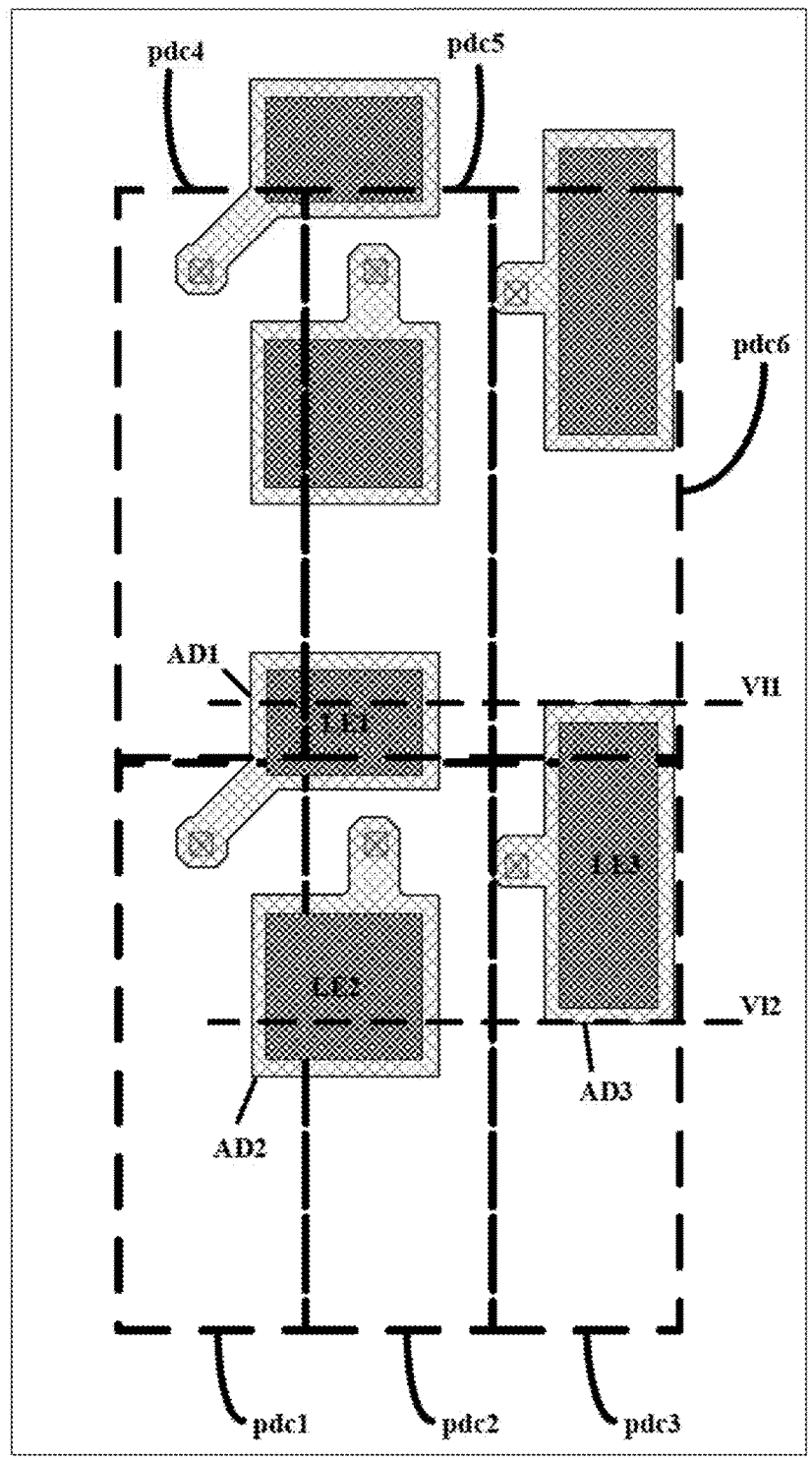
FIG. 20 illustrates an arrangement of light emitting elements in an array substrate in some embodiments according to the present disclosure.

In some embodiments, each data line is configured to provide the data signals to a column of pixel driving circuits (or a column of subpixels), and each voltage supply line is configured to provide high voltage signals to a column of pixel driving circuits (or a column of subpixels). FIG. 20 illustrates an arrangement of light emitting elements in an array substrate in some embodiments according to the present disclosure. Referring to FIG. 20, in some embodiments, the array substrate includes a first pixel driving circuit pdc1, a second pixel driving circuit pdc2, a third pixel driving circuit pdc3, a fourth pixel driving circuit pdc4, a fifth pixel driving circuit pdc5, and a sixth pixel driving circuit pdc6. Referring to FIG. 18 and FIG. 20, in some embodiments, the first data line DL1, the second data line DL2, and the third data line DL3 are configured to provide the data signals respectively to the first pixel driving circuit pdc1, the second pixel driving circuit pdc2, the third pixel driving circuit pdc3, the fourth pixel driving circuit pdc4, the fifth pixel driving circuit pdc5, and the sixth pixel driving circuit pdc6. The first pixel driving circuit pdc1, the second pixel driving circuit pdc2, and the third pixel driving circuit pdc3 are sequentially arranged along a direction substantially parallel to the first virtual line Vl1 or the second virtual line Vl2. The fourth pixel driving circuit pdc4, the fifth pixel driving circuit pdc5, and the sixth pixel driving circuit pdc6 are sequentially arranged along the direction substantially parallel to the first virtual line Vl1 or the second virtual line Vl2. The first pixel driving circuit pdc1 and the fourth pixel driving circuit pdc4 are arranged along a direction substantially parallel to the first data line DL1 or the first voltage supply line Vdd1. The second pixel driving circuit pdc2 and the fifth pixel driving circuit pdc5 are arranged along a direction substantially parallel to the second data line DL2 or the second voltage supply line Vdd2. The third pixel driving circuit pdc3 and the sixth pixel driving circuit pdc6 are arranged along a direction substantially parallel to the third data line DL3 or the third voltage supply line Vdd3.

Referring to FIG. 20, in some embodiments, the first light emitting element LE1 is driven by the first pixel driving circuit pdc1, and is at least partially in a region having the fifth pixel driving circuit pdc5. The second light emitting element LE2 is driven by the second pixel driving circuit pdc2, is partially in a region having the first pixel driving circuit pdc1, and partially in a region having the second pixel driving circuit pdc2. The third light emitting element LE3 is driven by the third pixel driving circuit pdc3, is partially in a region having the third pixel driving circuit pdc3, and partially in a region having the sixth pixel driving circuit pdc6.

Figure 21:
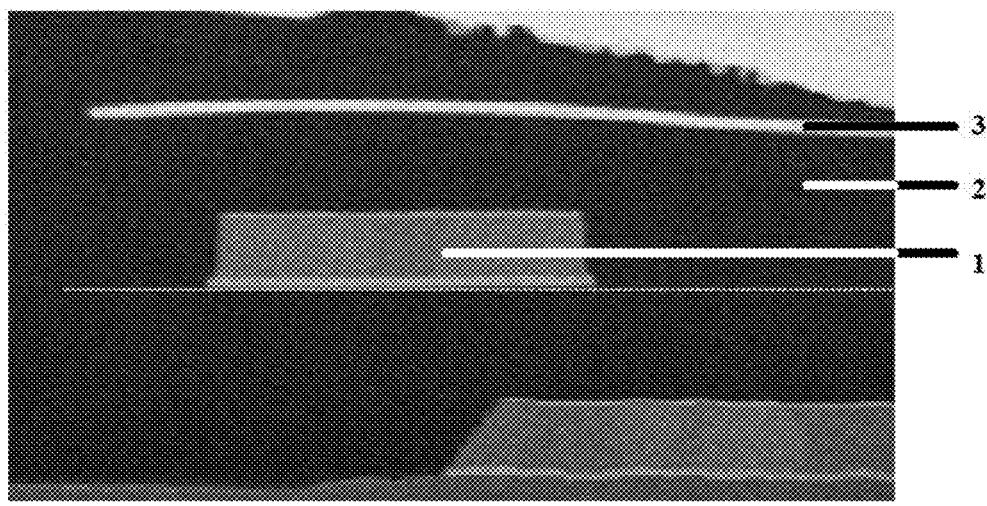
FIG. 21 is a cross-sectional image of an array substrate.

It is discovered in the present disclosure that a degree of evenness of anodes in a display panel could adversely affect image display. For example, color shift may result from the anodes being tilted. It is discovered in the present disclosure that signal lines underneath the anodes could significantly affect the degree the anodes being titled. In one example, underneath an anode, at one side a signal line is disposed while the other side is absent of a signal line. This results in an uneven surface of a planarization layer on top of the signal line. The uneven surface of the planarization layer in turn results in the anode on top of the planarization layer being tilted. FIG. 21 is a cross-sectional image of an array substrate. As shown in FIG. 21, the presence of a signal line 1 underneath a left side portion of the planarization layer 2 results in an uneven surface of the planarization, which in turn results in an anode 3 on top of the planarization layer 2 being titled toward the right side. The titled anode reflects more light toward the right side of the display panel. In the display panel, anodes associated with subpixels of different colors have different titled angles, thus light reflected by anodes in subpixels of different colors reflect light of different colors respectively at different angles. The accumulated effect of this issue lead to color shift at a large viewing angle.

Figure 22:
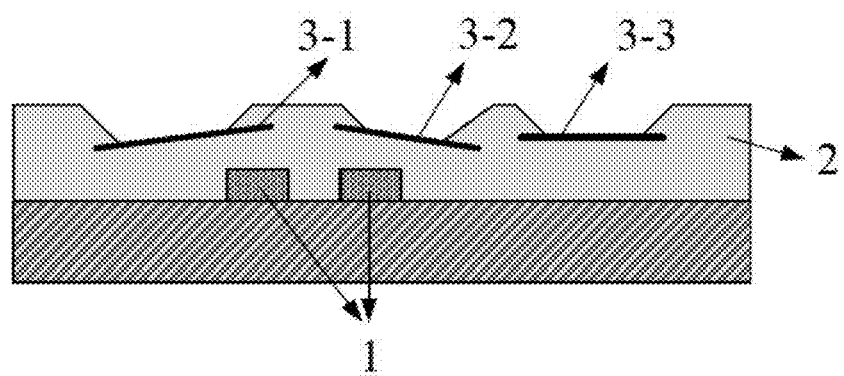
FIG. 22 is a schematic diagram illustrating a cross-sectional image of an array substrate.

FIG. 22 is a schematic diagram illustrating a cross-sectional image of an array substrate. As shown in FIG. 22, signal lines 1 are absent underneath a third anode 3-3, which is not titled. The signal lines 1 are present underneath anodes 3-1 and 3-2. However, the signal line is only present underneath a right side portion of the anode 3-1, and only present underneath a left side portion of the anode 3-2, resulting in these two anodes being titled. Anodes 3-1, 3-2, and 3-3 are respectively anodes of a red subpixel, a green subpixel, and a blue subpixel. Because the titled angles of the anodes in three subpixels of different colors are different from each other, color shift at a large viewing angle occurs.

Figure 23:
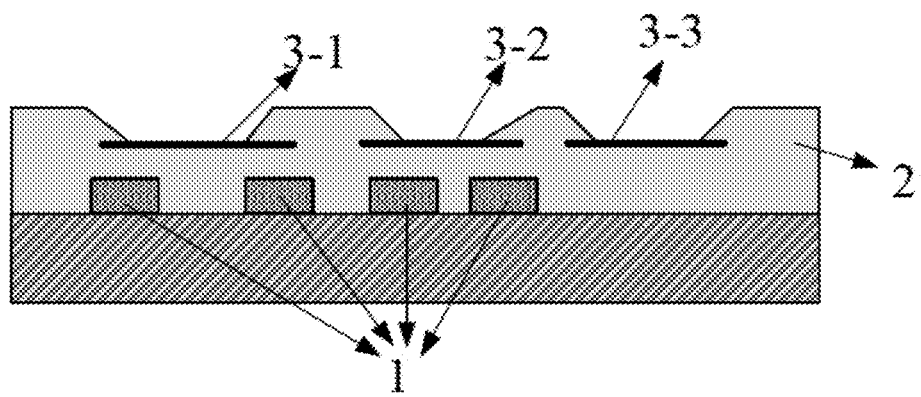
FIG. 23 is a schematic diagram illustrating a cross-sectional image of an array substrate.

FIG. 23 is a schematic diagram illustrating a cross-sectional image of an array substrate. As shown in FIG. 23, signal lines are present underneath both the left side portion and the right side portion of the anode 3-1, and present underneath both the left side portion and the right side portion of the anode 3-2. All anodes are substantially not titled, alleviating the color shift issue.

In the present array substrate, the third voltage supply line portion vp3 (underneath the third anode AD3) has an increased line width. As shown in FIG. 13A and FIG. 14, the main sub-portion msp and the third data line DL3 are mostly disposed underneath the right side portion of the third anode AD3. If not compensated, this would result in a titled anode and color shift in the display panel. By having a widening sub-portion wsp to increase the line width of the third voltage supply line portion vp3 underneath the third anode AD3, the signal lines (the third voltage supply line portion vp3 and the data line DL3) are more evenly distributed underneath both a left side portion and a right side portion of the third anode AD3, preventing the third anode being titled. As a result, color shift issue can be alleviated.

Figure 24:
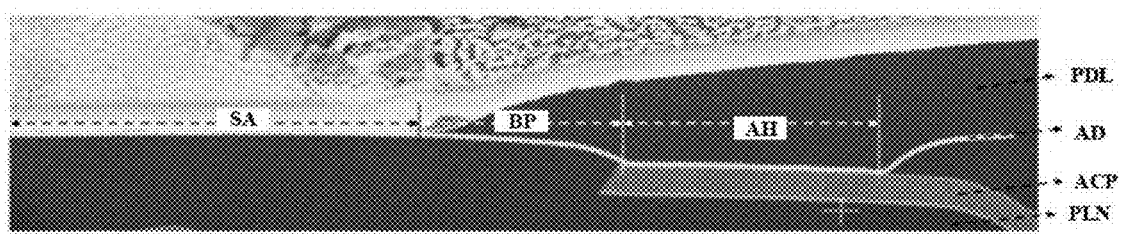
FIG. 24 is a cross-sectional image of an array substrate.

The presence of an anode contact hole in the array substrate could also affect the degree of titled angle of an associated anode. Moreover, residual planarization layer material in the anode contact hole could cover a portion of the anode. It is discovered in the present disclosure that these issues also affect performance of the display panel. FIG. 24 is a cross-sectional image of an array substrate. Referring to FIG. 24, an anode contact hole AH extends through the planarization layer PLN to expose a surface of an anode contact pad ACP. A portion of an anode AD is connected to the anode contact pad ACP through the anode contact hole AH. A pixel definition layer PDL is formed to define a subpixel aperture SA. As shown in FIG. 24, the anode AD includes a bridge portion BP connecting a main portion of the anode in the subpixel aperture SA to the anode contact pad ACP. By having the bridge portion BP to space apart the anode contact hole AH and the subpixel aperture SA, e.g., having the anode contact hole AH outside a region having the subpixel aperture SA, the adverse effects of the presence of the anode contact hole could be minimized or eliminated.

Figure 25:
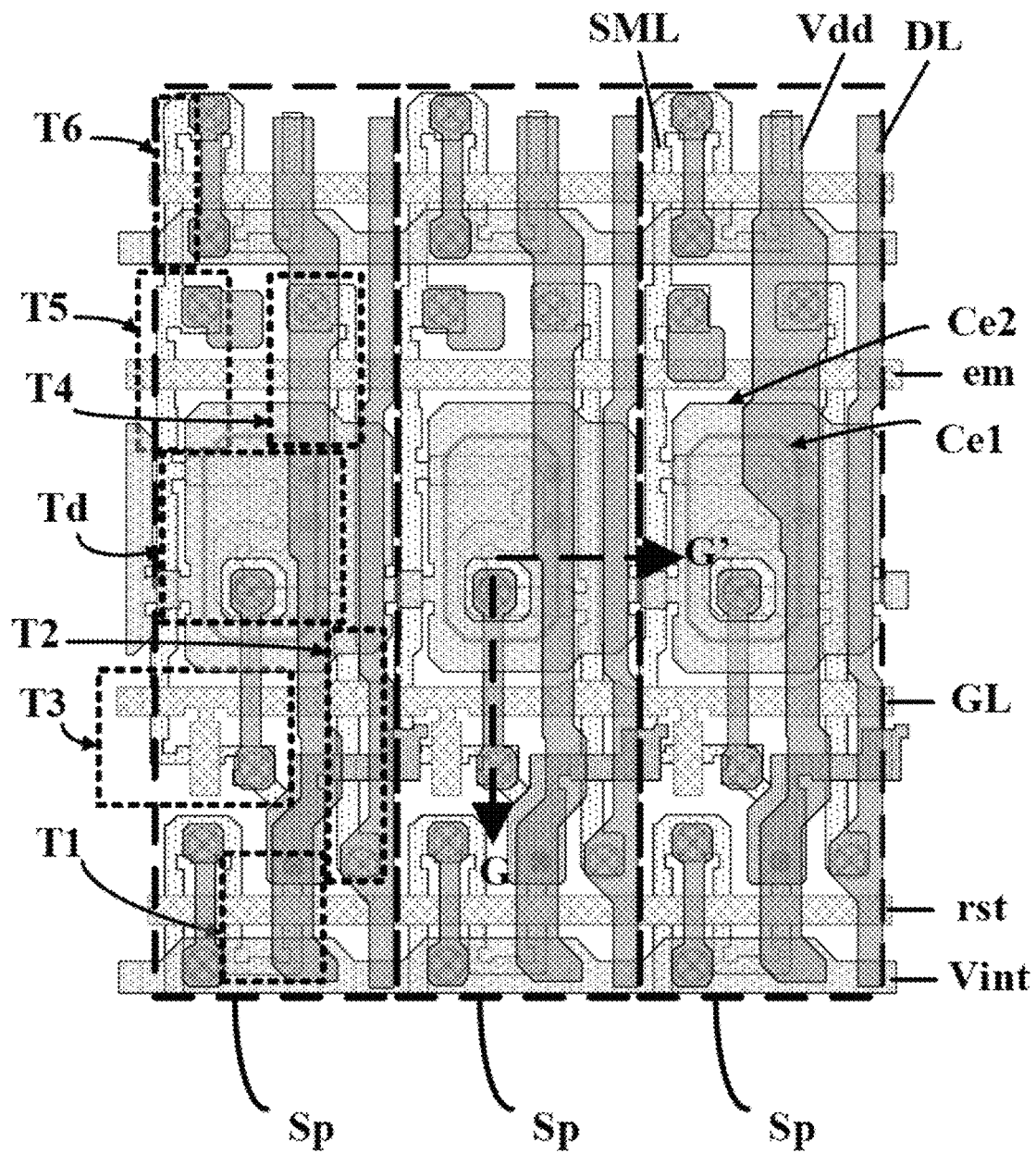
FIG. 25 is a diagram illustrating the structure of a plurality of subpixels of an array substrate in some embodiments according to the present disclosure.

FIG. 25 is a diagram illustrating the structure of a plurality of subpixels of an array substrate in some embodiments according to the present disclosure. Referring to FIG. 25, the plurality of subpixels Sp in some embodiments include a red subpixel, a green subpixel, and a blue subpixel.

Figure 26:
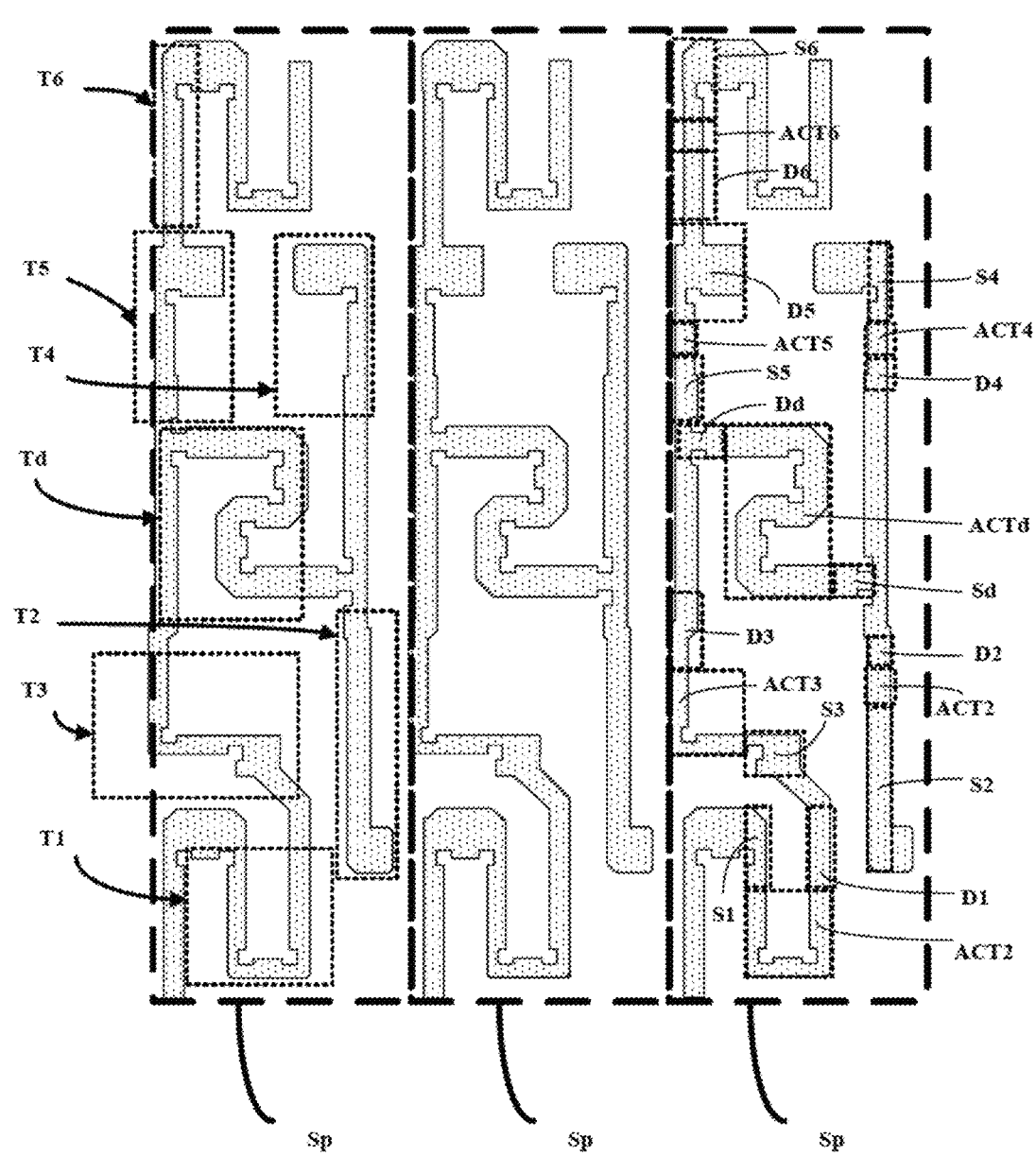
FIG. 26 is a diagram illustrating the structure of a semiconductor material layer in a plurality of subpixels of an array substrate in some embodiments according to the present disclosure.
Figure 27:
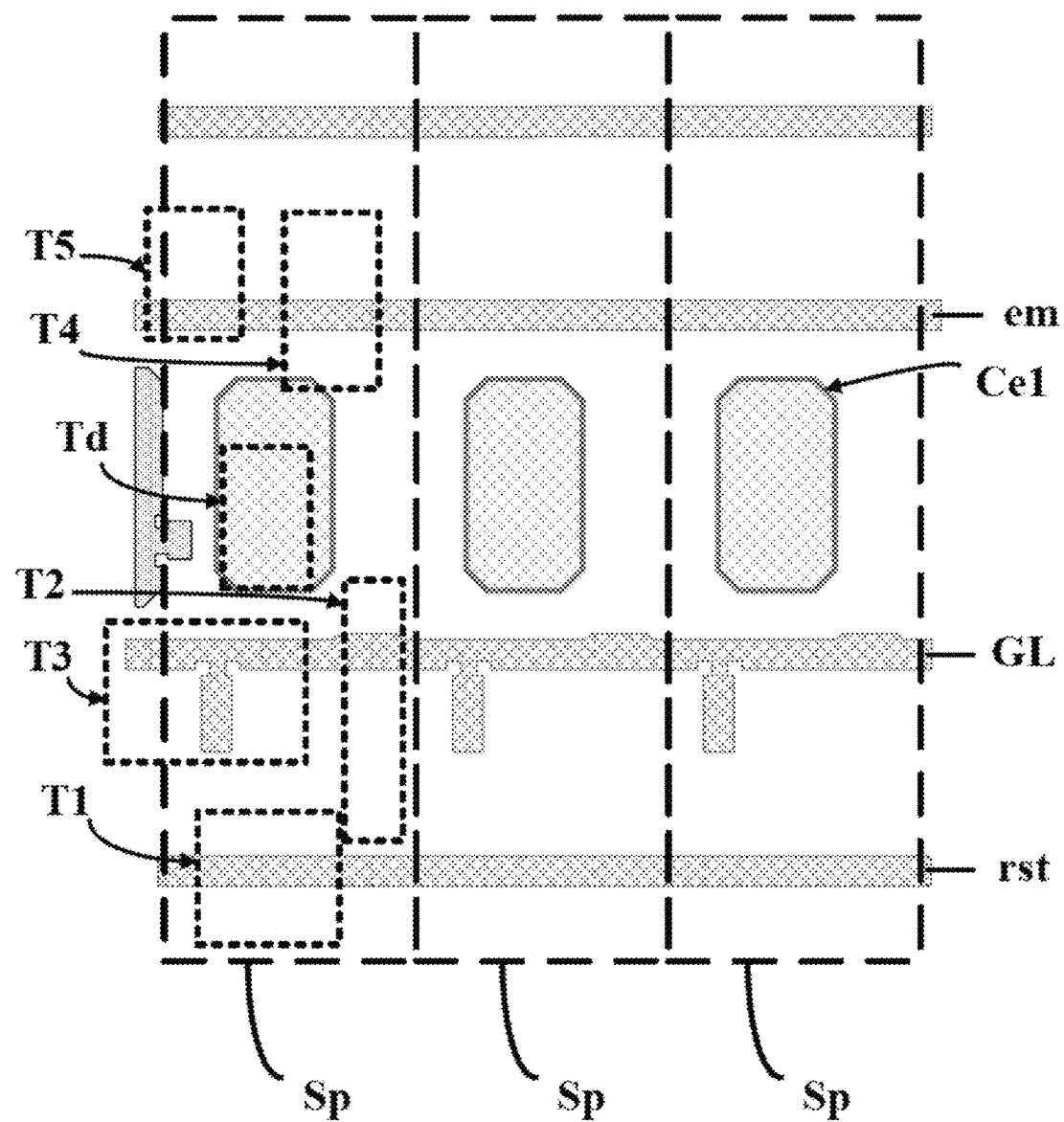
FIG. 27 is a diagram illustrating the structure of a first conductive layer in a plurality of subpixels of an array substrate in some embodiments according to the present disclosure.
Figure 28:
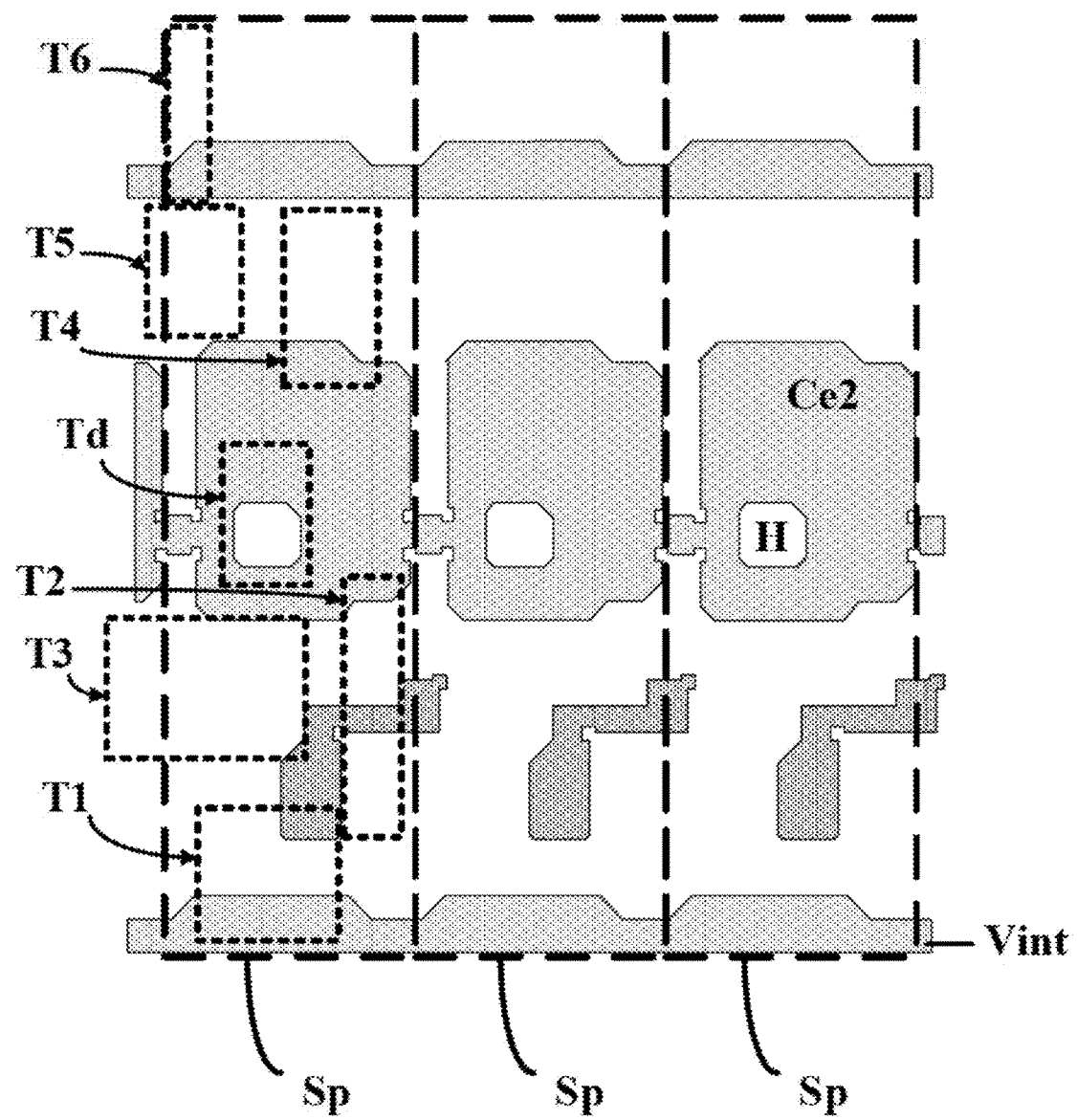
FIG. 28 is a diagram illustrating the structure of a second conductive layer in a plurality of subpixels of an array substrate in some embodiments according to the present disclosure.
Figure 29:
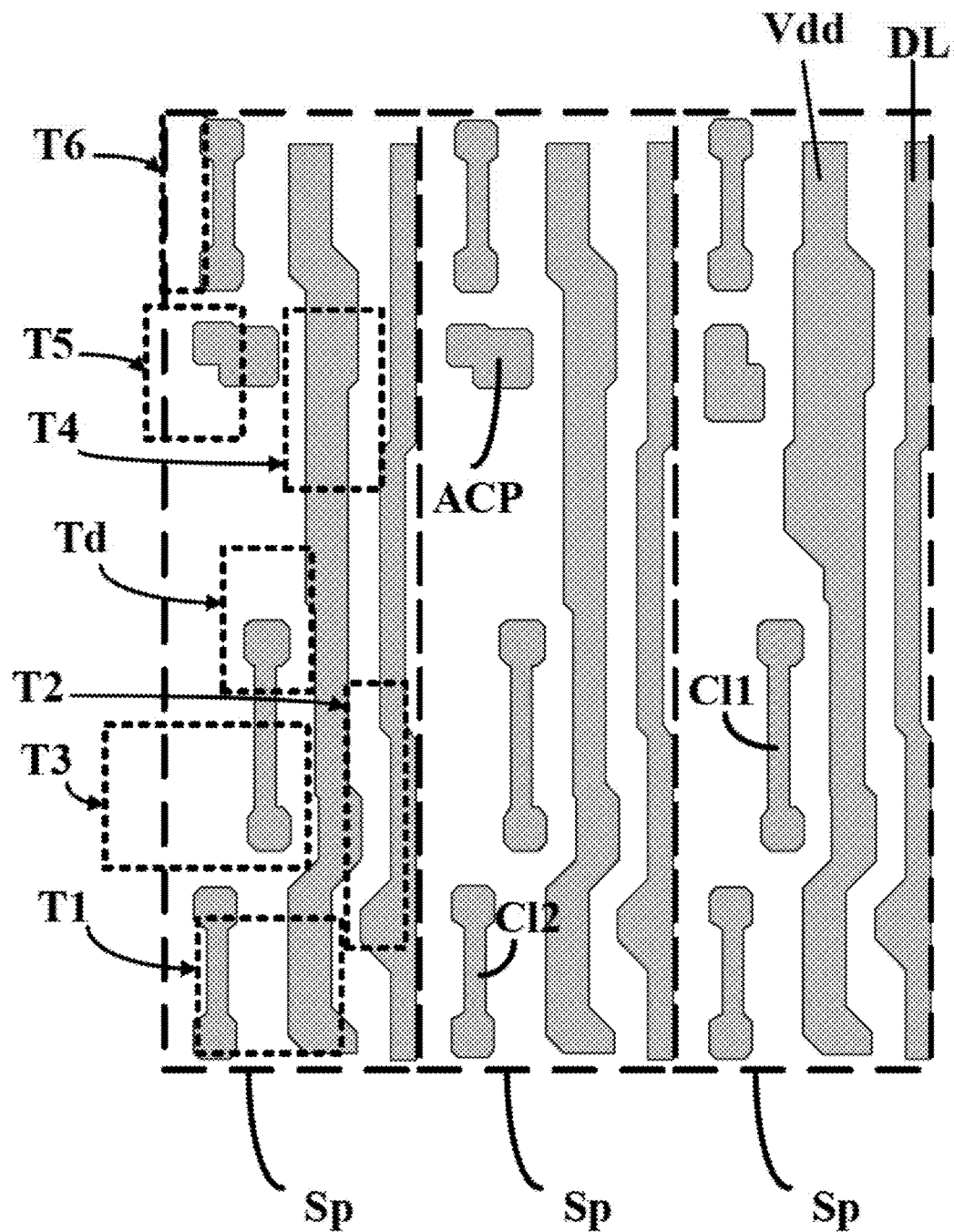
FIG. 29 is a diagram illustrating the structure of a signal line layer in a plurality of subpixels of an array substrate in some embodiments according to the present disclosure.
Figure 30:
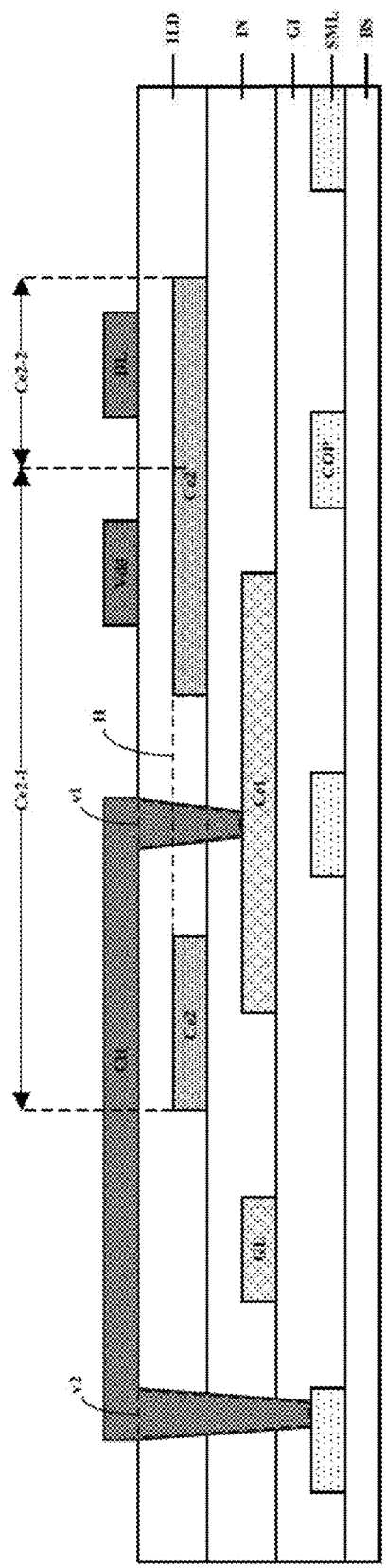
FIG. 30 is a cross-sectional view along a G-G' line in FIG. 25.

FIG. 26 is a diagram illustrating the structure of a semiconductor material layer in a plurality of subpixels of an array substrate in some embodiments according to the present disclosure. FIG. 27 is a diagram illustrating the structure of a first conductive layer in a plurality of subpixels of an array substrate in some embodiments according to the present disclosure. FIG. 28 is a diagram illustrating the structure of a second conductive layer in a plurality of subpixels of an array substrate in some embodiments according to the present disclosure. FIG. 29 is a diagram illustrating the structure of a signal line layer in a plurality of subpixels of an army substrate in some embodiments according to the present disclosure. FIG. 30 is a cross-sectional view along a G-G' line in FIG. 25. Referring to FIG. 25 to FIG. 30, in some embodiments, the array substrate includes a base substrate BS, a semiconductor material layer SML on the base substrate BS, a gate insulating layer GI on a side of the semiconductor material layer SML away from the base substrate BS, a first conductive layer on a side of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, and a signal line layer on a side of the inter-layer dielectric layer ILD away from the second conductive layer.

Referring to FIG. 2, FIG. 25, and FIG. 27, the first conductive layer in some embodiments includes a gate line GL, a reset control signal line rst, a light emitting control signal line em, and a first capacitor electrode Ce1 of the storage capacitor Cst. In FIG. 27, the subpixel Sp on the left is annotated with labels indicating regions corresponding to the plurality of transistors in the pixel driving circuit, including the first transistor T1, the second transistor T2, the third transistor T3, the fourth transistor T4, the fifth transistor T5, and the driving transistor Td. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the gate line GL, the reset control signal line rst, the light emitting control signal line em, and the first capacitor electrode Ce1 are in a same layer.

As used herein, the term "same layer" refers to the relationship between the layers simultaneously formed in the same step. In one example, the gate line GL and the first capacitor electrode Ce1 are in a same layer when they are formed as a result of one or more steps of a same patterning process performed in a same layer of material. In another example, the gate line GL and the first capacitor electrode Ce1 can be formed in a same layer by simultaneously performing the step of forming the gate line GL, and the step of forming the first capacitor electrode Ce1. The term "same layer" does not always mean that the thickness of the layer or the height of the layer in a cross-sectional view is the same.

Referring to FIG. 2, FIG. 25, and FIG. 28, the second conductive layer in some embodiments includes a reset signal line Vint, and a second capacitor electrode Ce2 of the storage capacitor Cst. In FIG. 28, the subpixel Sp on the left is annotated with labels indicating regions corresponding to the plurality of transistors in the pixel driving circuit, including the first transistor T1, the second transistor T2, the third transistor T3, the fourth transistor T4, the fifth transistor T5, and the driving transistor Td. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the reset signal line Vint and the second capacitor electrode Ce2 are in a same layer.

Referring to FIG. 2, FIG. 25, and FIG. 29, the signal line layer in some embodiments includes a voltage supply line Vdd, a data line DL, a first connecting line Cl1, and a second connecting line Cl2. In FIG. 29, the subpixel Sp on the left is annotated with labels indicating regions corresponding to the plurality of transistors in the pixel driving circuit, including the first transistor T1, the second transistor T2, the third transistor T3, the fourth transistor T4, the fifth transistor T5, and the driving transistor Td. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the voltage supply line Vdd, the dataline DL, the first connecting line Cl1, and the second connecting line Cl2 are in a same layer. As shown in FIG. 29, the data line DL is not completely straight but have a detour portion to avoid overlapping with the semiconductor material layer.

Referring to FIG. 2, FIG. 25, FIG. 27. FIG. 28, and FIG. 30, the storage capacitor Cst in some embodiments includes the first capacitor electrode Ce1, the second capacitor electrode Ce2, and the insulating layer IN between the first capacitor electrode Ce1 and the second capacitor electrode Ce2. As shown in FIG. 2, the second capacitor electrode Ce2 is electrically connected to the voltage supply line Vdd. For example, the second capacitor electrode Ce2 and the voltage supply line Vdd are configured to be provided with a same voltage at all time.

Referring to FIG. 2. FIG. 25, and FIG. 26, in some embodiments, in each subpixel, the semiconductor material layer has a unitary structure. In FIG. 26, the subpixel Sp on the left is annotated with labels indicating regions corresponding to the plurality of transistors in the pixel driving circuit, including the first transistor T1, the second transistor T2, the third transistor T3, the fourth transistor T4, the fifth transistor T5, and the driving transistor Td. In FIG. 26, the subpixel Sp on the right is annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The driving transistor Td includes an active layer ACTd, a source electrode Sd, and a drain electrode Dd. In one example, the active layers (ACT1, ACT2, ACT3, ACT4, ACT5, and ACTd), the source electrodes (S1, S2, S3, S4, S5, and Sd), and the drain electrodes (DL D2, D3, D4, D5, and Dd) of the transistors (T1, T2, T3, T4, T5, and Td) in a respective subpixel are parts of a unitary structure in the respective subpixel. In another example, the active layers (ACT1, ACT2, ACT3 ACT4, ACT5, and ACTd), the source electrodes (S1, S2, S3, S4, S5, and Sd), and the drain electrodes (D1, D2, D3, D4, D5, and Dd) of the transistors (T1, T2, T3, T4, T5, and Td) are in a same layer.

Figure 31:
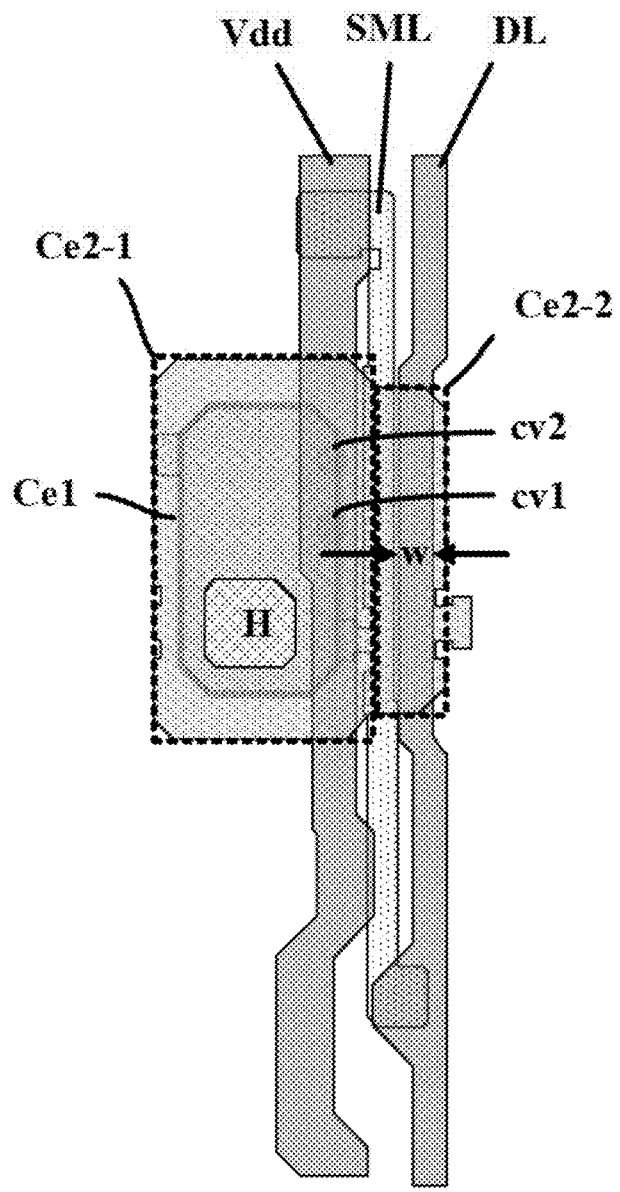
FIG. 31 is a diagram illustrating the structure of a region where signal lines crossing over a second capacitor electrode in an array substrate in some embodiments according to the present disclosure.
Figure 32:
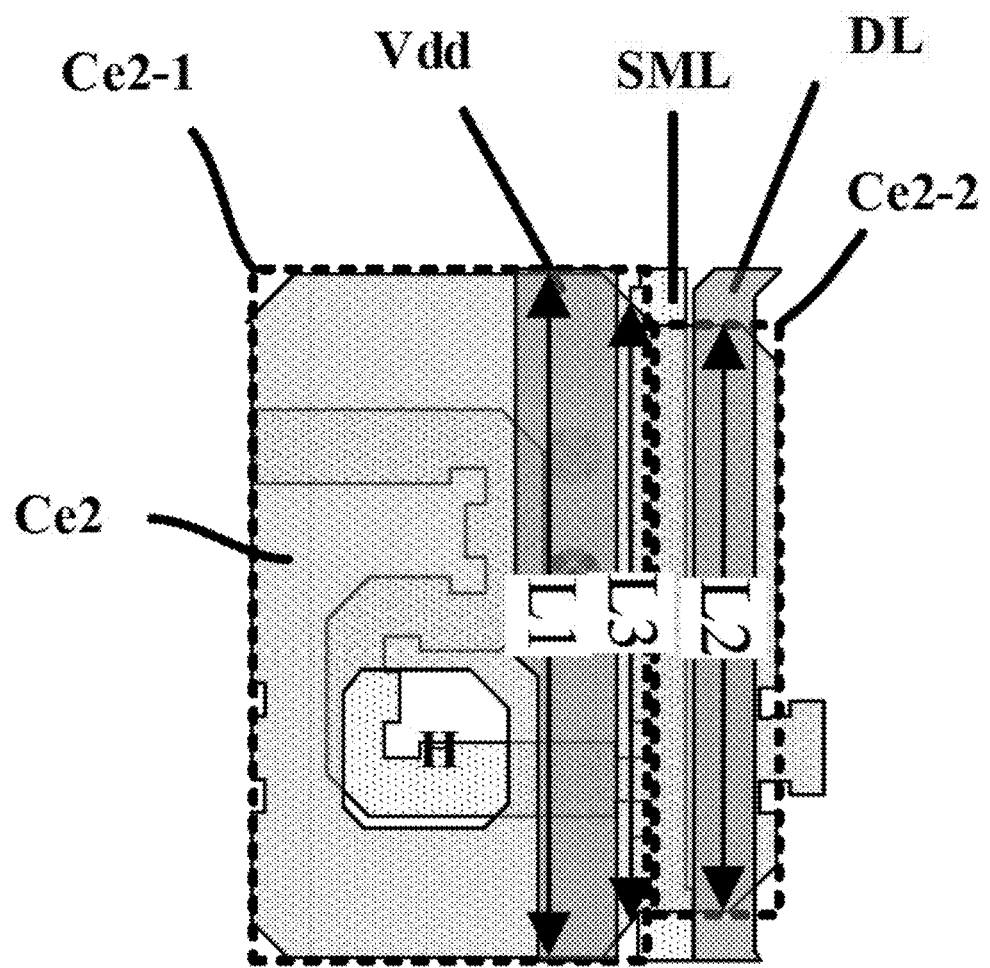
FIG. 32 is a further zoom-in view of the region where signal lines crossing over a second capacitor electrode in an array substrate in some embodiments according to the present disclosure.

FIG. 31 is a diagram illustrating the structure of a region where signal lines crossing over a second capacitor electrode in an array substrate in some embodiments according to the present disclosure. FIG. 32 is a further zoom-in view of the region where signal lines crossing over a second capacitor electrode in an array substrate in some embodiments according to the present disclosure. Referring to FIG. 31 and FIG. 32, in some embodiments, the second capacitor electrode Ce2 includes a first portion Ce2-1 and a second portion Ce-2 as parts of a unitary structure in a respective subpixel. Optionally, the first portion Ce2-1 and the second portion Ce-2 abut each other. Optionally, the voltage supply line Vdd crosses over the first portion Ce2-1 by a first crossing-over distance L1. Optionally, the data line DL crosses over the second portion Ce2-2 by a second crossing-over distance L2. Optionally, an area of the first portion Ce2-1 is greater than an area of the second portion Ce-2.

In some embodiments, the first crossing-over distance L1 is greater than the second crossing-over distance L2. Optionally, the first crossing-over distance L1 is greater than the second crossing-over distance L2 by no more than 30%, e.g., by no more than 25%, by no more than 20%, by no more than 15%, by no more than 10%, or by no more than 5%.

In some embodiments, referring to FIG. 25 and FIG. 31, the voltage supply line Vdd and the data line DL are substantially parallel to each other. As used herein, the term "substantially parallel" means that an included angle between two signal lines is in the range of 0 degree to approximately 25 degrees, e.g., 0 degree to approximately 5 degrees, 0 degree to approximately 10 degrees, 0 degree to approximately 15 degrees, or 0 degree to approximately 20 degrees. Referring to FIG. 32, a segment of the voltage supply line Vdd crossing over the first portion Ce2-1 and a segment of the data line DL crossing over the second portion Ce2-2 are substantially parallel to each other.

In some embodiments, referring to FIG. 32, the segment of the voltage supply line Vdd crosses over the first portion Ce2-1 by a first crossing-over area; and the segment of the data line DL crosses over the second portion Ce2-2 by a second crossing-over area. Optionally, the first crossing-over area is greater than the second crossing-over area, e.g., by no more than 30%, by no more than 25%, by no more than 20%, by no more than 15%, by no more than 10%, or by no more than 5%.

By having the second capacitor electrode Ce to have a first portion Ce2-1 and a second portion Ce2-2, and the first crossing-over distance L1 greater than the second crossing-over distance L2, the inventors in the present disclosure discovers that an unexpected advantage can be achieved, as compared to one having the first crossing-over distance L1 equal to the second crossing-over distance L2. In the present array substrate, the data line DL crosses over the second portion Ce2-2, forming a parasitic capacitance. The data line DL is loaded prior to turning on the transistors of the pixel driving circuit (e.g., the second transistor T2). When the transistors are turned on (e.g., by a gate scanning signal provided by the gate line), the presence of the parasitic capacitance can effectively prevent deterioration of the data signal in the data line DL. On the other hand, the overlapping between the data line DL and the second capacitor electrode Ce2 also results in source loading. Large source loading can cause signal delay and higher power consumption. By having the second crossing-over distance L2 less than the first crossing-over distance L1, a balance can be unexpectedly achieved between a parasitic capacitance required for maintaining the data signal when the transistors are turned on and a relatively small source loading. Moreover, because the source loading issue can be alleviated in the present array substrate, a total number of capacitance compensation circuits in the peripheral region of the array substrate can be significantly reduced, thus more space may be utilized for image display.

In some embodiments, referring to FIG. 31, the segment of the data line DL crossing over the second portion Ce2-2 has a line width w. Optionally, the line width w is in a range of 2.0 μm to 4.0 μm, e.g., 2.0 μm to 2.5 μm, 2.5 μm to 3.0 μm, 3.0 μm to 3.5 μm, or 3.5 μm to 4.0 μm. Optionally, the line width w is approximately 3.0 μm.

In some embodiments, referring to FIG. 31, the segment of the data line DL crosses over the second portion Ce2-2 by a crossing-over area in a range of 50 μm$^2$ to 90 μm$^2$, e.g., 50 μm$^2$ to 60 μm$^2$, 60 μm$^2$ to 70 μm$^2$, 70 μm$^2$ to 80 μm$^2$, or 80 μm$^2$ to 90 μm$^2$. Optionally, the crossing-over area is equal to or greater than 70 μm$^2$.

Referring to FIG. 2, FIG. 25, FIG. 27, FIG. 28, and FIG. 30, in some embodiments, an orthographic projection of the first portion Ce2-1 on a base substrate BS completely covers, with a margin, an orthographic projection of the first capacitor electrode Ce1 on the base substrate BS except for a hole region H in which a portion of the first portion Ce2-1 of the second capacitor electrode Ce2 is absent. The hole region H is in the middle of the first portion Ce2-1.

Referring to FIG. 2, FIG. 25, and FIG. 30, in some embodiments, the signal line layer includes a first connecting line Cl1 is on a side of the inter-layer dielectric layer ILD away from the second capacitor electrode Ce2. The first connecting line Cl1 is in a same layer as the voltage supply line Vdd and the data line DL. Optionally, the array substrate further includes a first via v1 in the hole region H and extending through the inter-layer dielectric layer ILD and the insulating layer IN. Optionally, the first connecting line Cl1 is connected to the first capacitor electrode Ce1 through the first via v.

In some embodiments, the first capacitor electrode Ce1 is on aside of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the first connecting line Cl1 is connected to the first capacitor electrode Ce1 through the first via v1, and is connected to the semiconductor material layer SML through the second via v2.

Referring to FIG. 2, FIG. 25, and FIG. 26, in some embodiments, a source electrode S3 of the third transistor T3, an active layer ACT3 of the third transistor T3, a drain electrode D3 of the third transistor, a source electrode S1 of the first transistor T1, an active layer ACT1 of the first transistor T1, a drain electrode D1 of the first transistor T1 are parts of a unitary structure in the respective subpixel, and optionally are in a same layer. Optionally, the first connecting line Cl1 is connected to the source electrode S3 of the third transistor T3 and the drain electrode D1 of the first transistor T1 through the second via v2.

Figure 33:
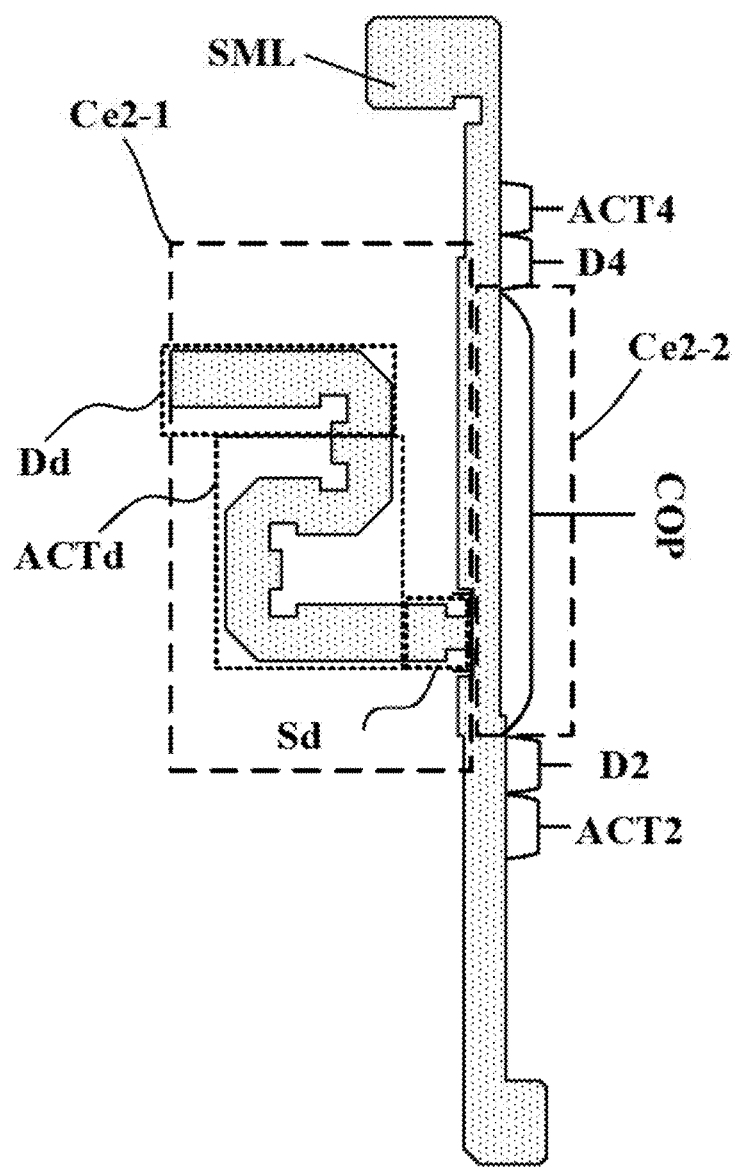
FIG. 33 is a diagram illustrating the structure of a region where a portion of a semiconductor layer crossing over a second capacitor electrode in an array substrate in some embodiments according to the present disclosure.

FIG. 33 is a diagram illustrating the structure of a region where a portion of a semiconductor layer crossing over a second capacitor electrode in an array substrate in some embodiments according to the present disclosure. Referring to FIG. 31, FIG. 32, and FIG. 33, the semiconductor material layer SML in some embodiments includes a crossing-over portion COP that crosses over at least one of the first portion Ce2-1 and the second portion Ce2-2 by a third crossing-over distance L3. Optionally, the crossing-over portion COP crosses over the first portion Ce2-1. Optionally, the crossing-over portion COP crosses over the second portion Ce2-2. Optionally, the crossing-over portion COP crosses over both the first portion Ce2-1 and the second portion Ce2-2. As shown in FIG. 32 and FIG. 33, in one example, a left part of the crossing-over portion COP crosses over the first portion Ce2-1, and a right part of the crossing-over portion COP crosses over the second portion Ce2-2, the left part and the right part are parallel to each other.

In one example, as shown in FIG. 33, the crossing-over portion COP, the voltage supply line Vdd, and the data line DL are substantially parallel to each other. In another example, the crossing-over portion COP, a segment of the voltage supply line Vdd crossing over the first portion Ce2-1, and a segment of the data line DL crossing over the second portion Ce2-2 are substantially parallel to each other.

Referring to FIG. 30, FIG. 31, FIG. 32, and FIG. 33, in some embodiments, an orthographic projection of the crossing-over portion COP on a base substrate BS, an orthographic projection of the voltage supply line Vdd on the base substrate BS, and an orthographic projection of the data line DL on the base substrate BS are substantially non-overlapping with respect to each other. As used herein, the term "substantially non-overlapping" refers to two orthographic projections being at least 90 percent (e.g., at least 92 percent, at least 94 percent, at least 96 percent, at least 98 percent, at least 99 percent, or 100 percent) non-overlapping. By having the data line DL and the crossing-over portion COP substantially overlapping, the source loading on the data line DL can be further reduced.

In some embodiments, an orthographic projection of the semiconductor layer on a base substrate BS, an orthographic projection of the voltage supply line Vdd on the base substrate BS, and an orthographic projection of the data line DL on the base substrate BS are substantially non-overlapping with respect to each other. The source loading on the data line DL can be further reduced.

In some embodiments, the third crossing-over distance L3 is equal to or less than the first crossing-over distance L1 and equal to or greater than the second crossing-over distance L2. Referring to FIG. 31, FIG. 32, and FIG. 33, in one example, the third crossing-over distance L3 is less than the first crossing-over distance L1 and greater than the second crossing-over distance L2.

Referring to FIG. 33 and FIG. 26, in some embodiments, a drain electrode D2 of the second transistor T2, an active layer ACT2 of the second transistor T2, a drain electrode D4 of the fourth transistor T4, an active layer ACT4 of the fourth transistor T4, a source electrode Sd of the driving transistor Td, an active layer ACTd of the driving transistor Td are parts of a unitary structure in the respective subpixel. Optionally, at least a part of the crossing-over portion COP directly connects the drain electrode D2 of the second transistor T2, the drain electrode D4 of the fourth transistor T4, and the source electrode Sd of the driving transistor Td to each other.

Figure 34:
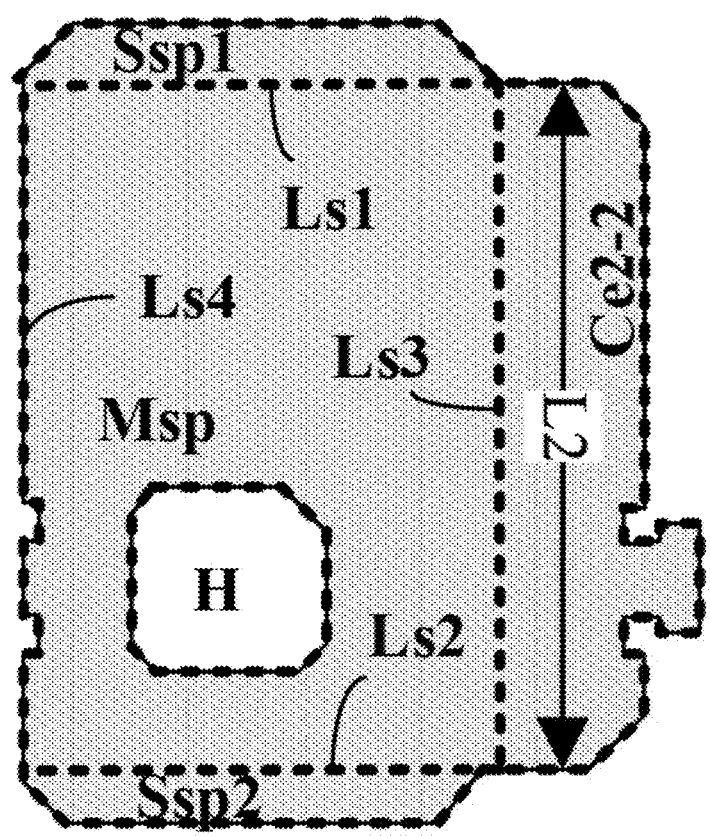
FIG. 34 illustrates the structure of a first portion and a second portion of a second capacitor electrode in an array substrate in some embodiments according to the present disclosure.

FIG. 34 illustrates the structure of a first portion and a second portion of a second capacitor electrode in an array substrate in some embodiments according to the present disclosure. Referring to FIG. 34, in some embodiments, the first portion Ce1 includes a main sub-portion Msp, a first side sub-portion Ssp1, and a second side sub-portion Ssp2. In one example, the main sub-portion Msp has a first lateral side Ls1, a second lateral side Ls2 opposite to the first lateral side Ls1, a third lateral side Ls3 connecting the first lateral side Ls1 and the second lateral side Ls2, and a fourth lateral side Ls4 opposite to the third lateral side Ls3. Optionally, the fourth lateral side Ls4 connects the first lateral side Ls1 and the second lateral side Ls2. Referring to FIG. 34, the first lateral side Ls1 abuts the first side sub-portion Ssp1; the second lateral side Ls2 abuts the second side sub-portion Ssp2; and the third lateral side Ls3 abuts the second portion Ce2-2. The main sub-portion Msp, the first side sub-portion Ssp1, the second side sub-portion Ssp2, the second portion Ce2-2 are parts of a unitary structure in the respective subpixel. In one example, the first lateral side Ls1 is a lateral side where the main sub-portion Msp directly connects to the first side sub-portion Ssp1; the second lateral side Ls2 is a lateral side where the main sub-portion Msp directly connects to the second side sub-portion Ssp2; and the third lateral side Ls3 is a lateral side where the main sub-portion Msp directly connects to the second portion Ce2-2. Accordingly, in some example, the third lateral side Ls3 is also a lateral side of the second portion Ce2-2. Optionally, a length of the third lateral side Ls3 is substantially same as the second crossing-over distance L2. As used herein, the term "substantially same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

In some embodiments, as shown in FIG. 33, the first side sub-portion Ssp1 has a substantially trapezoidal shape, the second side sub-portion Ssp2 has a substantially inverted trapezoidal shape. As used herein, "substantially trapezoidal shape" or "substantially inverted trapezoidal shape" can include shapes or geometries having at least one pair of substantially parallel sides (regardless of whether the other two sides include straight lines, curved lines or otherwise). As used herein, the term "substantially parallel sides" refers to two sides forming an included angle in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, or approximately 10 degrees to approximately 15 degrees. Optionally, the at least one pair of substantially parallel sides of the substantially trapezoidal shape includes a shorter side and a longer side, wherein the longer side is closer to the first lateral side Ls1 of the main sub-portion Msp. Optionally, the at least one pair of substantially parallel sides of the substantially inverted trapezoidal shape includes a shorter side and a longer side, wherein the longer side is closer to the second lateral side Ls2 of the main sub-portion Msp.

Figure 35:
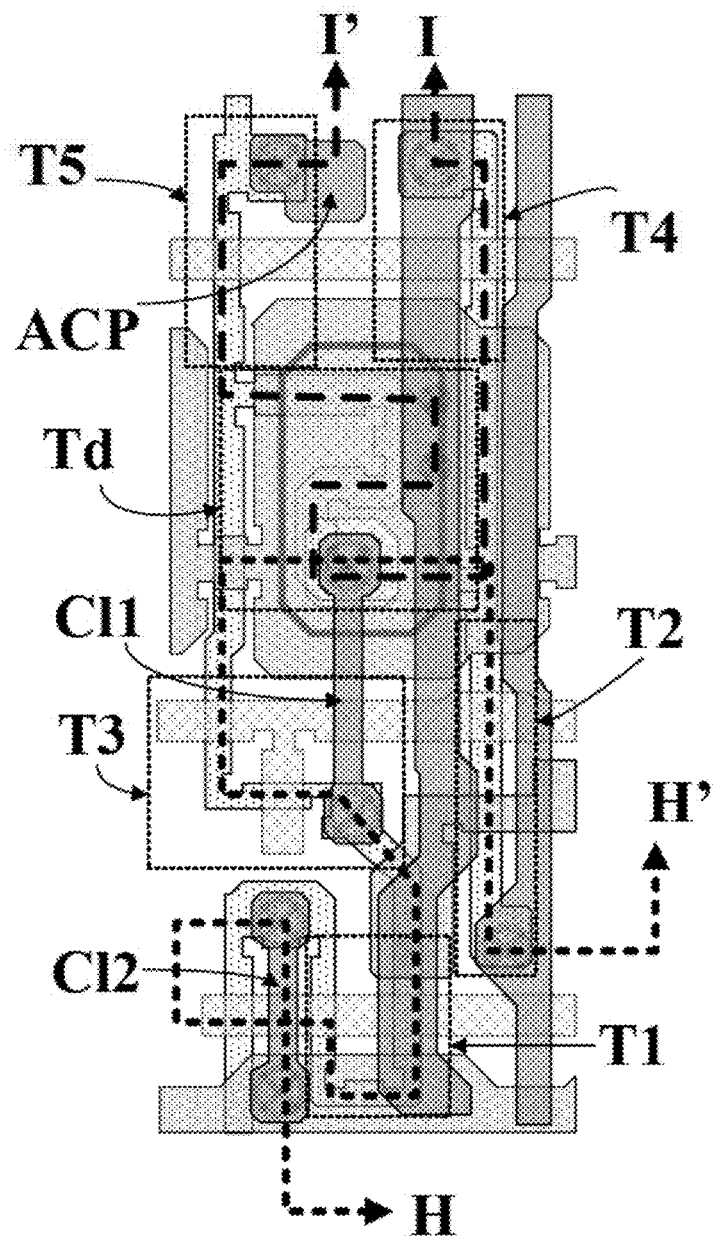
FIG. 35 is a diagram illustrating the structure of a subpixel of an array substrate in some embodiments according to the present disclosure.
Figure 36:
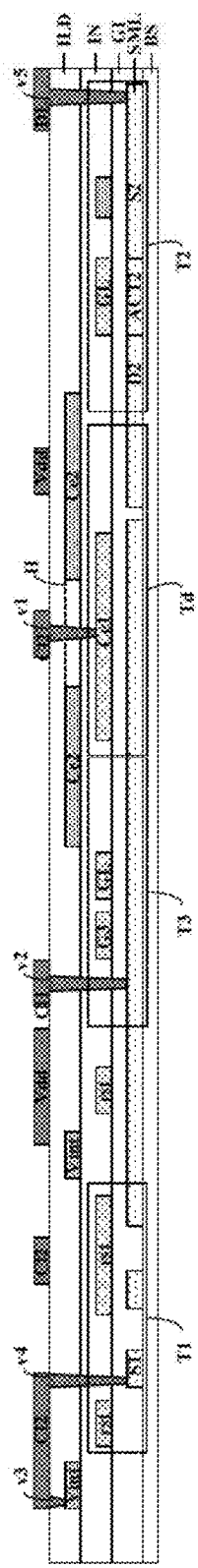
FIG. 36 is a cross-sectional view along an H-H' line in FIG. 35.
Figure 37:
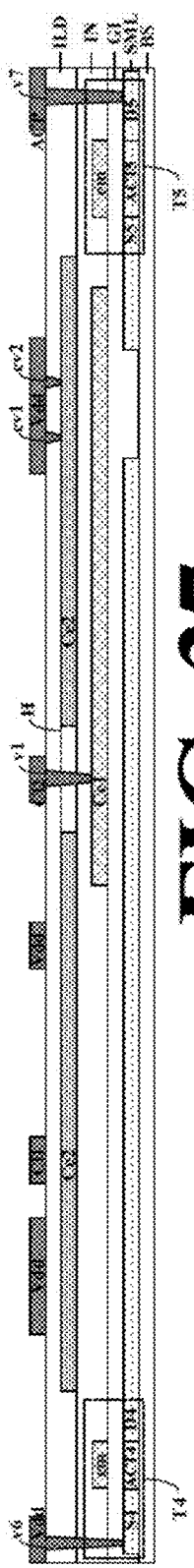
FIG. 37 is a cross-sectional view along an I-I' line in FIG. 35.

FIG. 35 is a diagram illustrating the structure of a subpixel of an array substrate in some embodiments according to the present disclosure. FIG. 36 is a cross-sectional view along an H-H' line in FIG. 35. FIG. 37 is a cross-sectional view along an I-I' line in FIG. 35. Referring to FIG. 25, FIG. 31, FIG. 35, and FIG. 37, in some embodiments, the array substrate further includes a connecting via (e.g., a first connecting via cv1 or a second connecting via cv2) extending through the inter-layer dielectric layer ILD. Optionally, the voltage supply line Vdd is connected to the first portion Ce2-1 of the second capacitor electrode Ce2 through the connecting via (e.g., through both the first connecting via cv1 and the second connecting via cv2). In some embodiments, the second capacitor electrode Ce2 is configured to be provided with a high voltage signal through the voltage supply line Vdd, as shown in the circuit diagram of FIG. 2.

Referring to FIG. 25, FIG. 29, FIG. 31, FIG. 35, FIG. 36, and FIG. 37, the signal line layer in some embodiments includes a voltage supply line Vdd, a data line DL, a first connecting line Cl1, and a second connecting line Cl2. Optionally, the second connecting line Cl2 is on a side of the inter-layer dielectric layer ILD away from the second capacitor electrode Ce2. Optionally, the second connecting line Cl2 is in a same layer as the voltage supply line Vdd and the data line DL. Referring to FIG. 25, FIG. 28, FIG. 31, FIG. 35, FIG. 36, and FIG. 37, the second conductive layer in some embodiments includes a second capacitor electrode Ce2 and a reset signal line Vint. Referring to FIG. 35, FIG. 36, and FIG. 37, the array substrate in some embodiments includes a third via v3. The third via v3 extends through the inter-layer dielectric layer ILD. The second connecting line Cl2 is connected to the reset signal line Vint through the third via v3. Optionally, the array substrate further includes a fourth via v4 extending through the inter-layer dielectric layer ILD, the insulating layer IN, and the gate insulating layer GI. The second connecting line Cl2 is connected to the semiconductor material layer SML through the fourth via v4.

Referring to FIG. 25, FIG. 26, and FIG. 36, in some embodiments, a source electrode S1 of the first transistor T1 and an active layer ACT1 of the first transistor T1 are parts of a unitary structure in the respective subpixel. The second connecting line Cl2 is connected to the source electrode S1 of the first transistor T1 through the fourth via v4. Referring to FIG. 2 and FIG. 36, a reset signal can be provided from the reset signal line Vint to the source electrode S1 of the first transistor T1 through the second connecting line Cl2.

Referring to FIG. 25, FIG. 29, FIG. 31, FIG. 35, and FIG. 36, the array substrate in some embodiments includes a fifth via v5 extending through the inter-layer dielectric layer ILD, the insulating layer IN, and the gate insulating layer GI. The data line DL is connected to the semiconductor material layer SML through the fifth via v5. Referring to FIG. 25, FIG. 26, and FIG. 36, in some embodiments, a source electrode S2 of the second transistor T2, an active layer ACT2 of the second transistor T2, and a drain electrode D2 of the second transistor T2 are parts of a unitary structure in the respective subpixel. The data line DL is connected to the source electrode S2 of the second transistor T2 through the fifth via v5. Referring to FIG. 2 and FIG. 36, a data signal can be provided from the data line DL to the source electrode S2 of the second transistor T2 through the fifth via v5.

Referring to FIG. 25, FIG. 29, FIG. 31, FIG. 35, and FIG. 37, the array substrate in some embodiments includes a sixth via v6 extending through the inter-layer dielectric layer ILD, the insulating layer IN, and the gate insulating layer GI. The voltage supply line Vdd is connected to the semiconductor material layer SML through the sixth via v6. Referring to FIG. 25, FIG. 26, and FIG. 37, in some embodiments, a source electrode S4 of the fourth transistor T4, an active layer ACT4 of the fourth transistor T4, and a drain electrode D4 of the fourth transistor T4 are parts of a unitary structure in the respective subpixel. The voltage supply line Vdd is connected to the source electrode S4 of the fourth transistor T4 through the sixth via v6. Referring to FIG. 2 and FIG. 36, a high voltage signal can be provided from the voltage supply line Vdd to the source electrode S4 of the fourth transistor T4 through the sixth via v6.

Referring to FIG. 25, FIG. 29, FIG. 31, FIG. 35, and FIG. 37, the array substrate in some embodiments includes a seventh via v7 extending through the inter-layer dielectric layer ILD, the insulating layer IN, and the gate insulating layer GI. An anode contact pad ACP is connected to the semiconductor material layer SML through the seventh via v7. Referring to FIG. 25, FIG. 26, and FIG. 37, in some embodiments, a source electrode S5 of the fifth transistor T5, an active layer ACT5 of the fifth transistor T5, and a drain electrode D5 of the fifth transistor T5 are parts of a unitary structure in the respective subpixel. The anode contact pad ACP is connected to the drain electrode D5 of the fifth transistor T5 through the seventh via v7. Referring to FIG. 2 and FIG. 36, a voltage signal is provided from the drain electrode D5 of the fifth transistor T5 to an anode of the light emitting element LE through the anode contact pad ACP for driving light emission of the light emitting element LE.

In some embodiments, and referring to FIG. 25 to FIG. 29, the plurality of subpixels Sp includes a first subpixel (e.g., the left one in FIG. 25), a second subpixel (e.g., the middle one in FIG. 25), and a third subpixel (e.g., the right one in FIG. 25). In the first subpixel (e.g., a red subpixel), the voltage signal line Vdd crosses over the semiconductor material layer SML by a first overlapping area. In the second subpixel (e.g., a green subpixel), the voltage signal line Vdd crosses over the semiconductor material layer SML by a second overlapping area. In the third subpixel (e.g., a blue subpixel), the voltage signal line Vdd crosses over the semiconductor material layer SML by a third overlapping area. Optionally, the third overlapping area is greater than the first overlapping area, and is greater than the second overlapping area.

In some embodiments, in the first subpixel (e.g., a red subpixel), the voltage signal line Vdd crosses over the second capacitor electrode Ce2 by a fourth overlapping area. In the second subpixel (e.g., a green subpixel), the voltage signal line Vdd crosses over the second capacitor electrode Ce2 by a fifth overlapping area. In the third subpixel (e.g., a blue subpixel), the voltage signal line Vdd crosses over the second capacitor electrode Ce2 by a sixth overlapping area. Optionally, the sixth overlapping area is greater than the fourth overlapping area, and is greater than the fifth overlapping area.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

In another aspect, the present invention provides a display apparatus, comprising the array substrate described herein or fabricated by a method described herein, and one or more integrated circuits connected to the array substrate In another aspect, the present invention provides a method of fabricating an array substrate. In some embodiments, the method includes forming a first pixel driving circuit, a second pixel driving circuit, and a third pixel driving circuit; forming a first data line, a second data line, and a third data line configured to provide data signals respectively to the first pixel driving circuit, the second pixel driving circuit, and the third pixel driving circuit; forming a first voltage supply line, a second voltage supply line, and a third voltage supply line configured to provide a high voltage signal respectively to the first pixel driving circuit, the second pixel driving circuit, and the third pixel driving circuit; and forming a first light emitting element, a second light emitting element, and a third light emitting element respectively connected to the first pixel driving circuit, the second pixel driving circuit, and the third pixel driving circuit. Optionally, a first virtual line and a second virtual line respectively cross over the first voltage supply line, the second voltage supply line, and the third voltage supply line. Optionally, the first voltage supply line, the second voltage supply line, and the third voltage supply line respectively comprise a first voltage supply line portion, a second voltage supply line portion, and a third voltage supply line portion, respectively between the first virtual line and the second virtual line. Optionally, an orthographic projection of a third anode of the third light emitting element on a base substrate completely covers an orthographic projection of the third voltage supply line portion on the base substrate. Optionally, the third voltage supply line portion has a third line width greater than a first line width of the first voltage supply line portion, and greater than a second line width of the second voltage supply line portion.

In some embodiments, the first virtual line and the second virtual line are formed to further respectively cross over the first data line, the second data line, the third data line. Optionally, forming the first data line, the second data line, the third data line respectively include forming a first data line portion, forming a second data line portion, forming a third data line portion, respectively between the first virtual line and the second virtual line. Optionally, the first data line portion, the second data line portion, and the third data line portion are formed to have a substantially same line width. Optionally, the orthographic projection of the third anode on the base substrate is at least partially overlapping with an orthographic projection of the third data line portion on the base substrate.

Optionally, the first data line, the second data line, the third data line, the first voltage supply line, the second voltage supply line, and the third voltage supply line are formed to be substantially parallel to each other. Optionally, data lines and voltage supply lines are alternatively arranged.

In some embodiments, forming the third voltage supply line portion includes forming a main sub-portion and forming a widening sub-portion. Optionally, the main sub-portion is between the widening sub-portion and the third data line. Optionally, the main sub-portion, the first voltage supply line portion, and the second voltage supply line portion have a same shape. Optionally, the main sub-portion, the first voltage supply line portion, and the second voltage supply line portion have a same shape and a same width.

In some embodiments, a first anode of the first light emitting element is formed between the first voltage supply line and the second data line; and a second anode of the second light emitting element is formed between the first voltage supply line and the second data line. Optionally, an orthographic projection of the first anode on the base substrate at least partially overlaps with an orthographic projection of the first data line on the base substrate and at least partially overlaps with an orthographic projection of the second voltage supply line on the base substrate. Optionally, an orthographic projection of the second anode on the base substrate at least partially overlaps with an orthographic projection of the first data line on the base substrate and at least partially overlaps with an orthographic projection of the second voltage supply line on the base substrate. Optionally, the orthographic projection of the first anode on the base substrate further at least partially overlaps with an orthographic projection of the first voltage supply line on the base substrate. Optionally, the orthographic projection of the second anode on the base substrate at least partially overlaps with an orthographic projection of the first voltage supply line on the base substrate.

In some embodiments, the method further includes forming a first anode contact pad, a second anode contact pad, and a third anode contact pad; forming a planarization layer on a side of the first anode contact pad, the second anode contact pad, and the third anode contact pad away from the base substrate; forming a first anode contact hole, a second anode contact hole, a third anode contact hole respectively extending through the planarization layer; forming a pixel definition layer on a side of the first anode, the second anode, and the third anode away from the planarization layer; forming a first subpixel aperture, a second subpixel aperture, and a third subpixel aperture respectively extending through the pixel definition layer; and forming a first light emitting layer, a second light emitting layer, and a third light emitting layer on a side of the pixel definition layer away from the base substrate. Optionally, the first anode, the second anode, and the third anode are formed to be respectively connected to the first anode contact pad, the second anode contact pad, and the third anode contact pad, respectively through the first anode contact hole, the second anode contact hole, and the third anode contact hole. Optionally, the first light emitting layer, the second light emitting layer, and the third light emitting layer are formed to be respectively connected to the first anode, the second anode, and the third anode, respectively through the first subpixel aperture, the second subpixel aperture, and the third subpixel aperture.

In some embodiments, the first anode contact hole is formed outside a region having the first subpixel aperture; the second anode contact hole is formed outside a region having the second subpixel aperture; and the third anode contact hole is formed outside a region having the third subpixel aperture.

In some embodiments, the method further includes forming at least one insulating layer, the at least one insulating layer formed between the base substrate and the first anode contact pad, the second anode contact pad, and the third anode contact pad. Optionally, the method further includes forming a first pad contact via, a second pad contact via, and a third pad contact via respectively extending through the at least one insulating layer. Optionally, the first anode contact pad, the second anode contact pad, and the third anode contact pad are formed to be respectively connected to the first pixel driving circuit, the second pixel driving circuit, and the third pixel driving circuit, respectively through the first pad contact via, the second pad contact via, and the third pad contact via. Optionally, along a direction of the first virtual line or the second virtual line, the first anode contact hole is formed between the first pad contact via and the first voltage supply line. Optionally, along the direction of the first virtual line or the second virtual line, the second anode contact hole is formed between the second pad contact via and the second voltage supply line. Optionally, the third pad contact via and the third anode contact hole are arranged along a direction substantially parallel to the third data line and the third voltage supply line.

In some embodiments, forming the first anode includes forming a first main portion and forming a first bridge portion; forming the second anode includes forming a second main portion and forming a second bridge portion; forming the third anode includes forming a third main portion and forming a third bridge portion. Optionally, the first main portion, the second main portion, and the third main portion have a substantially rectangular shape. Optionally, the first bridge portion, the second bridge portion, and the third bridge portion respectively protruding outward from the first main portion, the second main portion, and the third main portion.

In some embodiments, the method further includes forming a first anode contact pad, a second anode contact pad, and a third anode contact pad; forming a planarization layer on a side of the first anode contact pad, the second anode contact pad, and the third anode contact pad away from the base substrate; and forming a first anode contact hole, a second anode contact hole, a third anode contact hole respectively extending through the planarization layer. Optionally, the first bridge portion, the second bridge portion, and the third bridge portion are formed to be respectively connected to the first anode contact pad, the second anode contact pad, and the third anode contact pad, respectively through the first anode contact hole, the second anode contact hole, and the third anode contact hole.

Optionally, the third bridge portion protrudes outward from the third main portion along a direction substantially parallel to the first virtual line or the second virtual line. Optionally, the second bridge portion protrudes outward from the second main portion along a direction substantially parallel to the second data line or the second voltage supply line. Optionally, the first bridge portion protrudes outward from the first main portion along a direction at an angle oblique to the first virtual line and to the first data line.

In some embodiments, the first data line, the second data line, and the third data line further configured to provide the data signals respectively to a fourth pixel driving circuit, a fifth pixel driving circuit, and a sixth pixel driving circuit; the first pixel driving circuit, the second pixel driving circuit, and the third pixel driving circuit are sequentially arranged along a direction substantially parallel to the first virtual line or the second virtual line; the fourth pixel driving circuit, the fifth pixel driving circuit, and the sixth pixel driving circuit are sequentially arranged along the direction substantially parallel to the first virtual line or the second virtual line; the first pixel driving circuit and the fourth pixel driving circuit are arranged along a direction substantially parallel to the first data line or the first voltage supply line; the second pixel driving circuit and the fifth pixel driving circuit are arranged along a direction substantially parallel to the second data line or the second voltage supply line; and the third pixel driving circuit and the sixth pixel driving circuit are arranged along a direction substantially parallel to the third data line or the third voltage supply line.

In some embodiments, the first light emitting element is formed to be driven by the first pixel driving circuit, and is formed at least partially in a region having the fifth pixel driving circuit; the second light emitting element is formed to be driven by the second pixel driving circuit, is formed partially in a region having the first pixel driving circuit, and partially in a region having the second pixel driving circuit; and the third light emitting element is formed to be driven by the third pixel driving circuit, is formed partially in a region having the third pixel driving circuit, and partially in a region having the sixth pixel driving circuit.

In another aspect, the present invention provides a method of fabricating an army substrate. In some embodiments, the method includes forming a gate line; forming a data line; forming a voltage supply line; and forming a pixel driving circuit. Optionally, forming the pixel driving circuit includes forming a plurality of transistors and forming a storage capacitor. Optionally, forming the storage capacitor includes forming a first capacitor electrode, forming a second capacitor electrode, and forming an insulating layer between the first capacitor electrode and the second capacitor electrode. Optionally, the second capacitor electrode is formed to be electrically connected to the voltage supply line. Optionally, forming the second capacitor electrode includes forming a first portion and a second portion as parts of a first unitary structure in a respective subpixel. Optionally, the voltage supply line crosses over the first portion by a first crossing-over distance. Optionally, the data line crosses over the second portion by a second crossing-over distance. Optionally, the first crossing-over distance is greater than the second crossing-over distance.

In some embodiments, the voltage supply line and the data line are substantially parallel to each other; and a segment of the voltage supply line crossing over the first portion and a segment of the data line crossing over the second portion are substantially parallel to each other.

In some embodiments, the method further includes forming an inter-layer dielectric layer between the voltage supply line and the second capacitor electrode; and forming a connecting via extending through the inter-layer dielectric layer. Optionally, the voltage supply line is formed to be connected to the first portion of the second capacitor electrode through the connecting via.

In some embodiments, the method further includes forming a semiconductor material layer, a crossing-over portion of which is formed to cross over at least one of the first portion and the second portion by a third crossing-over distance. Optionally, the third crossing-over distance is equal to or less than the first crossing-over distance and equal to or greater than the second crossing-over distance. Optionally, the crossing-over portion crosses over both the first portion and the second portion.

In some embodiments, the crossing-over portion, the voltage supply line, and the data line are substantially parallel to each other; and the crossing-over portion, a segment of the voltage supply line crossing over the first portion, and a segment of the data line crossing over the second portion are substantially parallel to each other.

In some embodiments, forming the plurality of transistors includes forming a driving transistor; forming a first transistor; forming a second transistor; forming a third transistor; forming a fourth transistor; and forming a fifth transistor. Optionally, a drain electrode of the second transistor, an active layer of the second transistor, a drain electrode of the fourth transistor, an active layer of the fourth transistor, a source electrode of the driving transistor, an active layer of the driving transistor are formed as parts of a second unitary structure in the respective subpixel. Optionally, at least a part of the crossing-over portion is formed to directly connect the drain electrode of the second transistor, the drain electrode of the fourth transistor, and the source electrode of the driving transistor to each other.

In some embodiments, an orthographic projection of the crossing-over portion on a base substrate, an orthographic projection of the voltage supply line on the base substrate, and an orthographic projection of the data line on the base substrate are substantially non-overlapping with respect to each other.

In some embodiments, an orthographic projection of the first portion on a base substrate completely covers, with a margin, an orthographic projection of the first capacitor electrode on the base substrate except for a hole region in which a portion of the second capacitor electrode is absent.

In some embodiments, the method further includes forming an inter-layer dielectric layer between the voltage supply line and the second capacitor electrode; forming a first connecting line on a side of the inter-layer dielectric layer away from the second capacitor electrode, and in a same layer as the voltage supply line and the data line; and forming a first via in the hole region and extending through the inter-layer dielectric layer and the insulating layer. Optionally, the first connecting line is connected to the first capacitor electrode through the first via.

In some embodiments, the method further includes forming a semiconductor material layer on a base substrate; and forming a gate insulating layer on a side of the semiconductor material layer away from the base substrate. Optionally, the first capacitor electrode is formed on a side of the gate insulating layer away from the base substrate. Optionally, the method further includes forming a second via extending through the inter-layer dielectric layer, the insulating layer, and the gate insulating layer. Optionally, the first connecting line is connected to the semiconductor material layer through the second via.

In some embodiments, forming the plurality of transistors includes forming a driving transistor; forming a first transistor; forming a second transistor; forming a third transistor; forming a fourth transistor; and forming a fifth transistor. Optionally, a source electrode of the third transistor, an active layer of the third transistor, a drain electrode of the third transistor, a source electrode of the first transistor, an active layer of the first transistor, a drain electrode of the first transistor are parts of a second unitary structure in the respective subpixel. Optionally, the first connecting line is connected to the source electrode of the third transistor and the drain electrode of the first transistor through the second via.

In some embodiments, forming the first portion includes forming a main sub-portion, a first side sub-portion, and a second side sub-portion. Optionally, the main sub-portion is formed to have a first lateral side, a second lateral side opposite to the first lateral side, a third lateral side connecting the first lateral side and the second lateral side, and a fourth lateral side opposite to the third lateral side. Optionally, the first lateral side abuts the first side sub-portion. Optionally, the second lateral side abuts the second side sub-portion. Optionally, the third lateral side abuts the second portion. Optionally, the first side sub-portion has a substantially trapezoidal shape; and the second side sub-portion has a substantially inverted trapezoidal shape. Optionally, the third lateral side is a lateral side of the second portion; and a length of the third lateral side is substantially same as the second crossing-over distance.

In some embodiments, the method further includes forming an inter-layer dielectric layer between the voltage supply line and the second capacitor electrode; forming a second connecting line on a side of the inter-layer dielectric layer away from the second capacitor electrode, and in a same layer as the voltage supply line and the data line; forming a reset signal line on a side of the insulating layer away from the first capacitor electrode, and in a same layer as the second capacitor electrode; and forming a third via extending through the inter-layer dielectric layer. Optionally, the second connecting line is formed to be connected to the reset signal line through the third via.

In some embodiments, the method further includes forming a semiconductor material layer on the base substrate; and forming a gate insulating layer on a side of the semiconductor material layer away from the base substrate. Optionally, the first capacitor electrode is formed on a side of the gate insulating layer away from the base substrate. Optionally, the method further includes forming a fourth via extending through the inter-layer dielectric layer, the insulating layer, and the gate insulating layer. Optionally, the second connecting line is formed to be connected to the semiconductor material layer through the fourth via.

In some embodiments, forming the plurality of transistors includes forming a driving transistor; forming a first transistor; forming a second transistor; forming a third transistor; forming a fourth transistor; and forming a fifth transistor. Optionally, a source electrode of the first transistor and an active layer of the first transistor are parts of a second unitary structure in the respective subpixel. Optionally, the second connecting line is formed to be connected to the source electrode of the first transistor through the fourth via.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a first data line, a second data line, and a third data line configured to provide data signals respectively to a first pixel driving circuit, a second pixel driving circuit, and a third pixel driving circuit;
a first voltage supply line, a second voltage supply line, and a third voltage supply line configured to provide a constant voltage signal respectively to the first pixel driving circuit, the second pixel driving circuit, and the third pixel driving circuit; and
a first light emitting element, a second light emitting element, and a third light emitting element respectively connected to the first pixel driving circuit, the second pixel driving circuit, and the third pixel driving circuit;
wherein a first virtual line and a second virtual line respectively cross over the first voltage supply line, the second voltage supply line, and the third voltage supply line;
the first voltage supply line, the second voltage supply line, and the third voltage supply line respectively comprise a first voltage supply line portion, a second voltage supply line portion, and a third voltage supply line portion, respectively between the first virtual line and the second virtual line;
an orthographic projection of a third anode of the third light emitting element on a base substrate completely covers an orthographic projection of the third voltage supply line portion on the base substrate; and
the third voltage supply line portion has a third line width greater than a first line width of the first voltage supply line portion, and greater than a second line width of the second voltage supply line portion.

2. The array substrate of claim 1, wherein the first virtual line and the second virtual line further respectively cross over the first data line, the second data line, the third data line;
the first data line, the second data line, the third data line respectively comprise a first data line portion, a second data line portion, a third data line portion, respectively between the first virtual line and the second virtual line; and
the first data line portion, the second data line portion, and the third data line portion have a substantially same line width.

3. The array substrate of claim 2, wherein the orthographic projection of the third anode on the base substrate is at least partially overlapping with an orthographic projection of the third data line portion on the base substrate.

4. The array substrate of claim 1, wherein the first data line, the second data line, the third data line, the first voltage supply line, the second voltage supply line, and the third voltage supply line are substantially parallel to each other; and
data lines and voltage supply lines are alternatively arranged.

5. The array substrate of claim 1, wherein the third voltage supply line portion comprises a main sub-portion and a widening sub-portion;
the main sub-portion is between the widening sub-portion and the third data line; and
the main sub-portion, the first voltage supply line portion, and the second voltage supply line portion have a same shape.

6. The array substrate of claim 5, wherein the main sub-portion, the first voltage supply line portion, and the second voltage supply line portion have a same shape and a same width.

7. The array substrate of claim 1, wherein a first anode of the first light emitting element is between the first voltage supply line and the second data line; and
a second anode of the second light emitting element is between the first voltage supply line and the second data line.

8. The array substrate of claim 7, wherein an orthographic projection of the first anode on the base substrate at least partially overlaps with an orthographic projection of the first data line on the base substrate and at least partially overlaps with an orthographic projection of the second voltage supply line on the base substrate; and
an orthographic projection of the second anode on the base substrate at least partially overlaps with an orthographic projection of the first data line on the base substrate and at least partially overlaps with an orthographic projection of the second voltage supply line on the base substrate.

9. The array substrate of claim 8, wherein the orthographic projection of the first anode on the base substrate further at least partially overlaps with an orthographic projection of the first voltage supply line on the base substrate; and
the orthographic projection of the second anode on the base substrate at least partially overlaps with an orthographic projection of the first voltage supply line on the base substrate.

10. The array substrate of claim 7, further comprising:
a first anode contact pad, a second anode contact pad, and a third anode contact pad;
a planarization layer on a side of the first anode contact pad, the second anode contact pad, and the third anode contact pad away from the base substrate;
a first anode contact hole, a second anode contact hole, a third anode contact hole respectively extending through the planarization layer;
a pixel definition layer on a side of the first anode, the second anode, and the third anode away from the planarization layer;
a first subpixel aperture, a second subpixel aperture, and a third subpixel aperture respectively extending through the pixel definition layer; and
a first light emitting layer, a second light emitting layer, and a third light emitting layer on a side of the pixel definition layer away from the base substrate;
wherein the first anode, the second anode, and the third anode are respectively connected to the first anode contact pad, the second anode contact pad, and the third anode contact pad, respectively through the first anode contact hole, the second anode contact hole, and the third anode contact hole; and
the first light emitting layer, the second light emitting layer, and the third light emitting layer are respectively connected to the first anode, the second anode, and the third anode, respectively through the first subpixel aperture, the second subpixel aperture, and the third subpixel aperture.

11. The array substrate of claim 10, wherein the first anode contact hole is outside a region having the first subpixel aperture;
the second anode contact hole is outside a region having the second subpixel aperture; and
the third anode contact hole is outside a region having the third subpixel aperture.

12. The array substrate of claim 10, further comprising at least one insulating layer between the base substrate and the first anode contact pad, the second anode contact pad, and the third anode contact pad;
a first pad contact via, a second pad contact via, and a third pad contact via respectively extending through the at least one insulating layer; and
the first anode contact pad, the second anode contact pad, and the third anode contact pad are respectively connected to the first pixel driving circuit, the second pixel driving circuit, and the third pixel driving circuit, respectively through the first pad contact via, the second pad contact via, and the third pad contact via.

13. The array substrate of claim 12, wherein, along a direction of the first virtual line or the second virtual line, the first anode contact hole is between the first pad contact via and the first voltage supply line;
along the direction of the first virtual line or the second virtual line, the second anode contact hole is between the second pad contact via and the second voltage supply line; and
the third pad contact via and the third anode contact hole are arranged along a direction substantially parallel to the third data line and the third voltage supply line.

14. The array substrate of claim 7, wherein the first anode comprises a first main portion and a first bridge portion;
the second anode comprises a second main portion and a second bridge portion;
the third anode comprises a third main portion and a third bridge portion;
the first main portion, the second main portion, and the third main portion have a substantially rectangular shape; and
the first bridge portion, the second bridge portion, and the third bridge portion respectively protruding outward from the first main portion, the second main portion, and the third main portion.

15. The array substrate of claim 14, further comprising:
a first anode contact pad, a second anode contact pad, and a third anode contact pad;
a planarization layer on a side of the first anode contact pad, the second anode contact pad, and the third anode contact pad away from the base substrate;
a first anode contact hole, a second anode contact hole, a third anode contact hole respectively extending through the planarization layer;
wherein the first bridge portion, the second bridge portion, and the third bridge portion are respectively connected to the first anode contact pad, the second anode contact pad, and the third anode contact pad, respectively through the first anode contact hole, the second anode contact hole, and the third anode contact hole.

16. The array substrate of claim 14, wherein the third bridge portion protrudes outward from the third main portion along a direction substantially parallel to the first virtual line or the second virtual line;
the second bridge portion protrudes outward from the second main portion along a direction substantially parallel to the second data line or the second voltage supply line; and the first bridge portion protrudes outward from the first main portion along a direction at an angle oblique to the first virtual line and to the first data line.

17. The array substrate of claim 1, wherein the first data line, the second data line, and the third data line further configured to provide the data signals respectively to a fourth pixel driving circuit, a fifth pixel driving circuit, and a sixth pixel driving circuit;
the first pixel driving circuit, the second pixel driving circuit, and the third pixel driving circuit are sequentially arranged along a direction substantially parallel to the first virtual line or the second virtual line;
the fourth pixel driving circuit, the fifth pixel driving circuit, and the sixth pixel driving circuit are sequentially arranged along the direction substantially parallel to the first virtual line or the second virtual line;
the first pixel driving circuit and the fourth pixel driving circuit are arranged along a direction substantially parallel to the first data line or the first voltage supply line;
the second pixel driving circuit and the fifth pixel driving circuit are arranged along a direction substantially parallel to the second data line or the second voltage supply line; and
the third pixel driving circuit and the sixth pixel driving circuit are arranged along a direction substantially parallel to the third data line or the third voltage supply line.

18. The array substrate of claim 17, wherein the first light emitting element is driven by the first pixel driving circuit, and is at least partially in a region having the fifth pixel driving circuit;
the second light emitting element is driven by the second pixel driving circuit, is partially in a region having the first pixel driving circuit, and partially in a region having the second pixel driving circuit; and
the third light emitting element is driven by the third pixel driving circuit, is partially in a region having the third pixel driving circuit, and partially in a region having the sixth pixel driving circuit.

19. The array substrate of claim 1, wherein the third line width is in a range of 8.0 μm to 10.0 μm, the first line width is in a range of 5.0 μm to 6.0 μm, and the second line width is in a range of 5.0 μm to 6.0 μm.

20. A display apparatus, comprising the array substrate of claim 1, and an integrated circuit connected to the array substrate.

* * * * *